US012696008B2

(12) United States Patent
You et al.

(10) Patent No.: US 12,696,008 B2
(45) Date of Patent: Jul. 28, 2026

(54) INTEGRATED CAPACITOR FOR IMAGE SENSOR

(71) Applicant: Taiwan Semiconductor Manufacturing Company, Ltd., Hsinchu (TW)

(72) Inventors: Bing Cheng You, Taichung City (TW); Feng-Chi Hung, Chu-Bei City (TW); Hsin-Hung Chen, Tainan City (TW); Wen-I Hsu, Tainan City (TW); Jen-Cheng Liu, Hsin-Chu City (TW); Tzu-Jui Wang, Fengshan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/796,403

(22) Filed: Aug. 7, 2024

(65) Prior Publication Data

US 2025/0287121 A1 Sep. 11, 2025

Related U.S. Application Data

(60) Provisional application No. 63/562,860, filed on Mar. 8, 2024.

(51) Int. Cl.

*H04N 25/771* (2023.01)
*H04N 25/59* (2023.01)
*H04N 25/79* (2023.01)
*H10F 39/00* (2025.01)

(52) U.S. Cl.

CPC ........... *H04N 25/771* (2023.01); *H04N 25/59* (2023.01); *H04N 25/79* (2023.01); *H10F 39/014* (2025.01); *H10F 39/8037* (2025.01); *H10F 39/811* (2025.01)

(58) Field of Classification Search

CPC ...... H04N 25/771; H04N 25/59; H04N 25/79; H10F 39/014; H10F 39/8037; H10F 39/811

See application file for complete search history.

(56) References Cited

U.S. PATENT DOCUMENTS

2005/0035271 A1* 2/2005 Kochi .................. H04N 25/701 348/E3.018
2005/0062867 A1* 3/2005 Mabuchi ................ H04N 25/59 348/E3.018

(Continued)

OTHER PUBLICATIONS

Zaidi et al. "Evaluation of Compensation Techniques for CMOS Operational Amplifier Design" 2018 International Conference on IC Design & Technology (ICICDT), published on Jul. 2, 2018.

*Primary Examiner* — Nicholas G Giles
(74) *Attorney, Agent, or Firm* — Eschweiler & Potashnik, LLC

(57) ABSTRACT

Some embodiments relate to a device, including: a photodetector; and a pixel circuit, comprising: a floating diffusion node and an output node; a transfer transistor electrically coupled from the floating diffusion node to the photodetector; a source follower transistor comprising a gate electrode electrically coupled to the floating diffusion node; a row select transistor electrically coupled from a source/drain region of the source follower transistor to the output node; and a capacitor electrically coupled from the output node to the floating diffusion node.

20 Claims, 21 Drawing Sheets

(56) References Cited

U.S. PATENT DOCUMENTS

| | | | | |
|---|---|---|---|---|
| 2005/0121519 | A1* | 6/2005 | Shinohara .............. | H04N 25/77 348/E3.018 |
| 2007/0103574 | A1* | 5/2007 | Tanaka ................... | H04N 25/00 348/308 |
| 2009/0237539 | A1* | 9/2009 | Watanabe ............ | H04N 25/626 348/301 |
| 2023/0247325 | A1 | 8/2023 | Zha et al. | |
| 2024/0015414 | A1 | 1/2024 | Mabuchi et al. | |

* cited by examiner

INTEGRATED CAPACITOR FOR IMAGE SENSOR

REFERENCE TO RELATED APPLICATION

This application claims the benefit of U.S. Provisional Application No. 63/562,860, filed on Mar. 8, 2024, the contents of which are incorporated by reference in their entirety.

BACKGROUND

Integrated circuits (ICs) with image sensors are used in a wide range of modern-day electronic devices, such as, for example, cameras, cellphones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
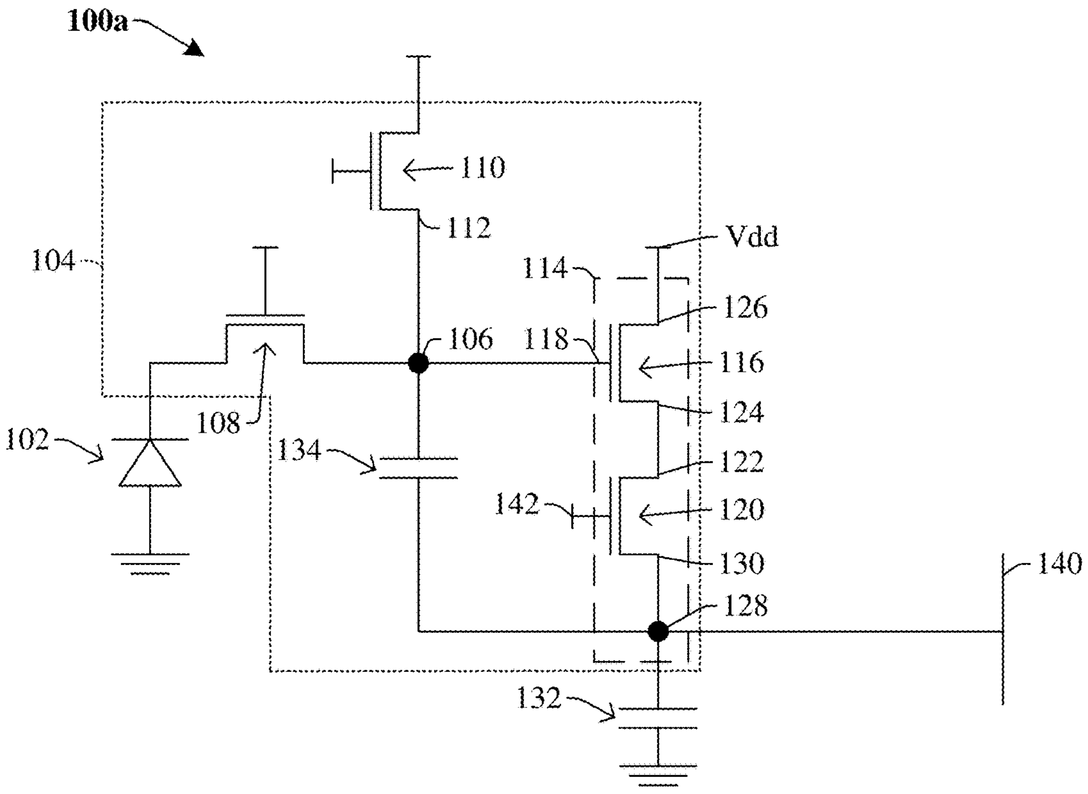
FIGS. 1A, 1B, and 1C illustrate circuit schematics of some embodiments of an image sensor with a capacitor between an output node and a floating diffusion node.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

An image sensor comprises a pixel array with a plurality of photodetectors and a plurality of pixel circuits coupled to the photodetectors. The plurality of pixel circuits comprise a floating diffusion node, a transfer transistor extending between the floating diffusion node and the photodetector, a reset transistor with a source/drain terminal coupled to the floating diffusion node, and an output stage coupled to the floating diffusion node. The output stage comprises a source follower transistor with a gate electrode coupled to the floating diffusion node and further comprises a row select transistor with a first source/drain terminal coupled to a source/drain terminal of the source follower transistor. An output node is at a second source/drain terminal of the row select transistor. The plurality of pixel circuits is organized in a plurality of rows and columns, and each column of the plurality of pixel circuits have output nodes coupled together by an output line.

In some embodiments, the image sensor spans multiple substrates bonded together through bond layers. The reset transistor and the output stage are on a first substrate. The photodetector and the floating diffusion node are within a second substrate coupled to the first substrate by a first bond layer. The floating diffusion node is coupled to the output stage through a metal bond pad within the first bond layer. A shield structure is also within the first bond layer and continuously surrounds the metal bond pad.

A total parasitic capacitance $C_{tot}$ at the output line is a sum of pixel parasitic capacitance values $C_{js}$ between output nodes of the plurality of pixel circuits coupled to an output line. The total capacitance $C_{tot}$ increases an RC delay of the image sensor. The increased RC delay results in a greater amount of time taken to transfer the signals from the pixel circuit to an image signal processor (ISP) circuit. The gain of the image sensor in low information environments (e.g., when using a conversion gain circuit to image areas with low amounts of light) are also reduced due to the total capacitance $C_{tot}$. The RC delay further results in a reduction in bandwidth of the image sensor. Therefore, a method of mitigating the total capacitance $C_{tot}$ is desirable.

The present disclosure provides for a capacitor being included between the output node and the floating diffusion node. Applying the Miller theorem across the capacitor, the output stage having a gain of less than one results in the capacitance $C_H$ of the capacitor as viewed from the output node appearing to be negative. Therefore, the combination of the pixel parasitic capacitance value $C_{js}$ and the $C_H$ value for a pixel circuit is less than the pixel parasitic capacitance value $C_{js}$ alone. Applying this result across the pixel circuits coupled to the output line results in a reduction in the perceived capacitance as viewed from the output of the circuit. This reduction in perceived capacitance reduces the RC delay of the image sensor, increasing the gain in low information applications (e.g., imaging areas with low amounts of light) and the bandwidth of the image sensor. The increase in the gain in low information applications results in an increase in the dynamic range of the image sensor and consequently an increase in the quality of images produced by the image sensor.

Figure 1B:
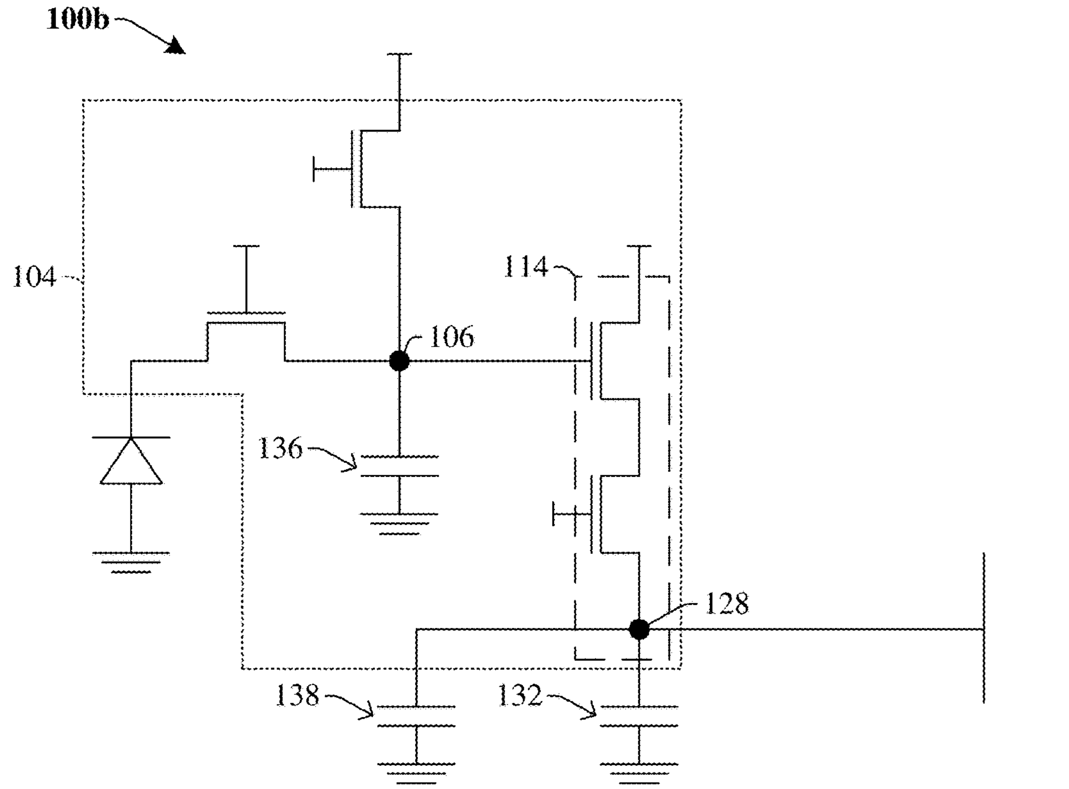
Figure 1C:
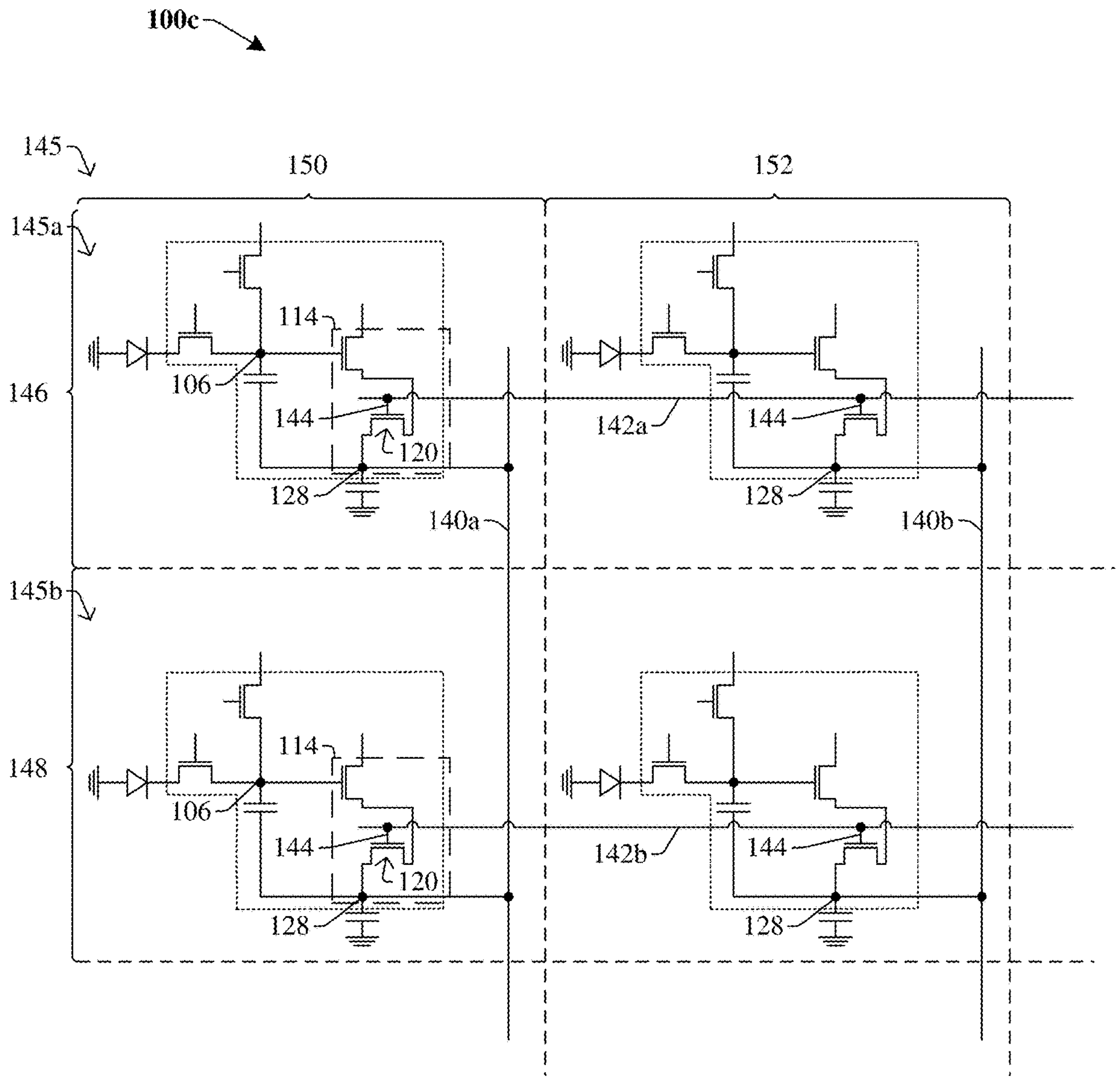

FIGS. 1A, 1B, and 1C illustrate circuit schematics 100a, 100b, 100c of some embodiments of an image sensor with a capacitor between an output node and the floating diffusion node.

A photodetector 102 is coupled to a pixel circuit 104. The pixel circuit 104 comprises a floating diffusion node 106, a transfer transistor 108 extending between the floating diffusion node 106 and the photodetector 102, a reset transistor 110 with a source/drain terminal 112 coupled to the floating diffusion node 106, and an output stage 114 coupled to the floating diffusion node 106. The output stage 114 comprises a source follower transistor 116 with a first gate electrode 118 coupled to the floating diffusion node 106 and a row select transistor 120 with a first source/drain terminal 122 coupled to a second source/drain terminal 124 of the source follower transistor 116. A third source/drain terminal 126 of the source follower transistor is coupled to a voltage supply rail Vdd. An output node 128 is coupled to a fourth source/drain terminal 130 of the row select transistor 120. An output line 140 is coupled to the output node 128, and a row select line 142 is coupled to a gate electrode of the row select transistor 120.

The output node 128 has a parasitic capacitance $C_{js}$ that is represented by a first capacitor 132. A second capacitor 134 is coupled between the output node 128 and the floating diffusion node 106 and has a capacitance $C_H$. The capacitance $C_H$ and the parasitic capacitance $C_{js}$ both affect the perceived capacitance at the output node 128. The perceived capacitance due to the second capacitor 134 depends on a ratio of a voltage at the output node 128 to a voltage at the floating diffusion node 106. The ratio of the voltage at the output node to the voltage at the floating diffusion node 106 may also be represented as the gain of the output stage 114.

When the gain of the output stage 114 is greater than one (e.g., when the voltage at the output node 128 is greater than the voltage at the floating diffusion node 106), the perceived capacitance of the second capacitor 134 is positive, and the total perceived capacitance at the output node is greater than the capacitance at the output node supplied by the parasitic capacitance $C_{js}$. When the gain of the output stage 114 is less than one (e.g., when the voltage at the output node 128 is less than the voltage at the floating diffusion node 106), the perceived capacitance of the second capacitor 134 is negative, and the total perceived capacitance at the output node is less than the capacitance at the output node 128 supplied by the parasitic capacitance $C_{js}$ (see FIG. 1B for greater detail). The reduction in the total capacitance $C_{tot}$ perceived at the output node 128 reduces the RC delay in the image sensor, which increases the gain in low information applications. The gain is increased due to the reduction in time constant of the pixel array, resulting in increasing the range of magnitudes of the signal available within a measurement timeframe and the bandwidth of the image sensor (e.g., by reducing the time constant, reducing the minimum measurement timeframe to transfer the signals from the pixel circuits to the ISP circuit). The increase in the gain in low information applications results in an increase in the dynamic range of the image sensor and an increase in the quality of images produced by the image sensor.

As shown in the circuit schematic 100b of FIG. 1B, an equivalent circuit to the one shown in the circuit schematic 100a of FIG. 1A is provided. The second capacitor (see 134 of FIG. 1A) may be treated as a third capacitor 136 coupled between the floating diffusion node 106 and ground, and a fourth capacitor 138 coupled between the output node 128 and ground. This results in a circuit where the perceived capacitance at the output node 128 can be determined by adding the capacitance of the first capacitor 132 to the capacitance of the fourth capacitor 138, for each pixel circuit 104 of the plurality of pixel circuits coupled to the output line 140. The capacitance $C_4$ of the fourth capacitor 138 may be determined based on the capacitance $C_H$ of the second capacitor (see 134 of FIG. 1A) by using Miller's theorem (substituting the initial impedance Z of Miller's Theorem with the impedance of the second capacitor and the output impedance $Z_2$ of Miller's Theorem with the impedance of the fourth capacitor):

$$\frac{1}{jwC_4} = \frac{\frac{1}{jwC_H}}{1 - \frac{1}{k}} \tag{1}$$

Where k is the ratio of the voltage at the output node 128 to the voltage at the floating diffusion node 106 (e.g., the gain of the output stage 114). Equation (1) may be simplified and solved for $C_4$, resulting in Equation (2) shown below:

$$C_4 = C_H\left(1\frac{1}{k}\right) \tag{2}$$

As shown in Equation (2), when k is greater than one, the factor that the capacitance $C_H$ is multiplied by to derive $C_4$ is positive, leading to $C_4$ being positive. Further, when k is less than one, the factor that the capacitance $C_H$ is multiplied by to derive $C_4$ is negative, resulting in $C_4$ being negative. As the first capacitor 132 (representing the parasitic capacitance $C_{js}$) and the fourth capacitor 138 are in parallel in the equivalent circuit shown in FIG. 1B, the total perceived capacitance at the output node 128 may be found by finding the sum of all the capacitances coupled to the output node 128. In the pixel circuit shown in FIG. 1B, when k is less than one, the sum of the parasitic capacitance $C_{js}$ and the capacitance $C_4$ is less than the parasitic capacitance $C_{js}$, resulting in a reduction in the perceived capacitance at the output node 128.

As shown in the circuit schematic 100*c* of FIG. 1C, a plurality of pixel circuits 145 is organized into a plurality of rows 146, 148 and columns 150, 152. A first row select line 142*a* is coupled to gate electrodes 144 of row select transistors 120 in a first row 146 of pixel circuits. A second row select line 142*b* is coupled to gate electrodes 144 of row select transistors 120 in a second row 148 of pixel circuits. A first output line 140*a* is coupled to output nodes 128 of a first column 150 of pixel circuits. A second output line 140*b* is coupled to output nodes 128 of a second column 152 of pixel circuits.

The perceived capacitance at the first output line 140*a* is affected by the parasitic capacitance $C_{js}$ and the capacitance $C_H$ of each pixel circuit in the first column 150. The total capacitance $C_{tot}$ perceived at the output line can be found by finding the sum of the parasitic capacitance and the capacitance $C_4$ where an equivalent circuit as shown in FIG. 1B is used in place of the pixel circuits 104 of FIG. 1C. The total capacitance $C_{tot}$ is found using Equation 3 shown below:

$$C_{tot} = n * C_{js} + n * \left(C_H\left(1\frac{1}{k}\right)\right) \quad (3)$$

Where n is the total number of pixel circuits in the first column 150. For example, when the gain of the output stage of the pixel circuits is 0.9, one ninth of the capacitance $C_H$ is subtracted from the total capacitance $C_{tot}$ perceived at the first output line 140*a*. The capacitance $C_H$ and the gain across the capacitors per pixel circuit 104 in the first column 150 also are included in $C_{tot}$.

Figure 2:
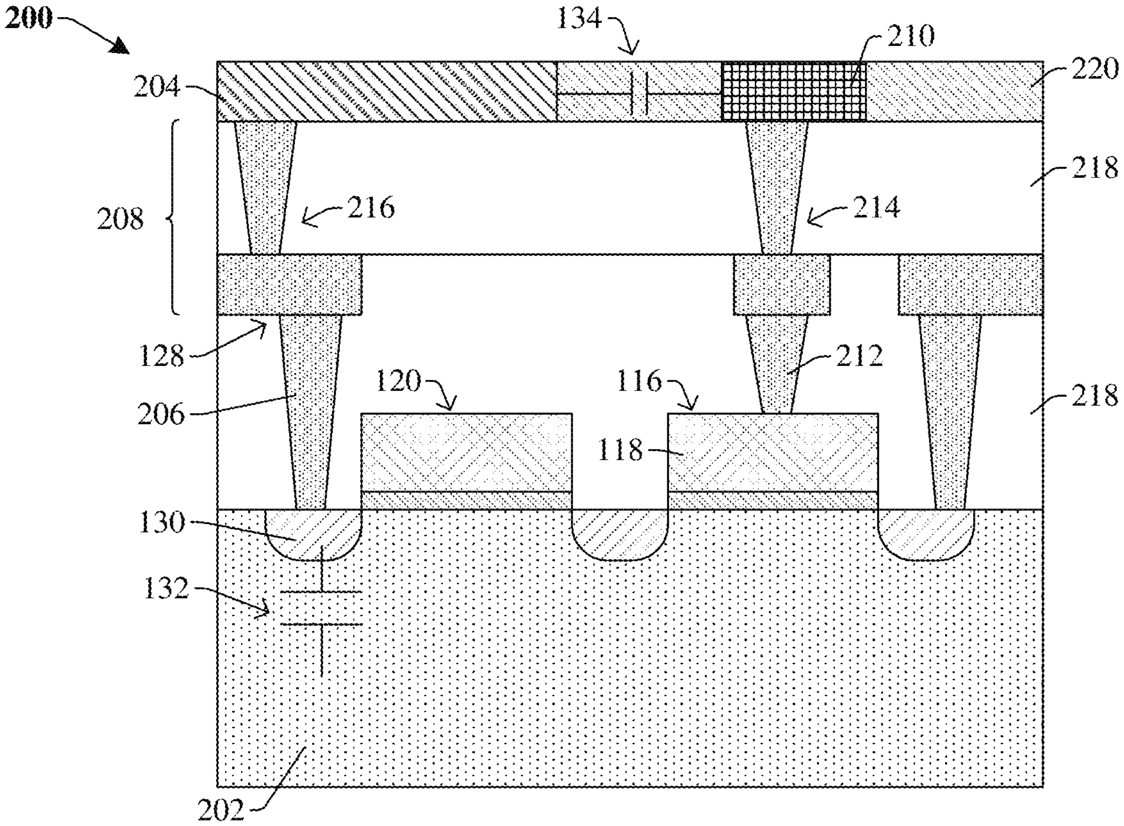
FIG. 2 illustrates a cross-sectional view of an output stage of some embodiments of an image sensor with a capacitor between the output node and the floating diffusion node.

FIG. 2 illustrates a cross-sectional view 200 of an output stage of some embodiments of an image sensor with a capacitor between an output node and the floating diffusion node.

The parasitic capacitance $C_{js}$ (as represented by the first capacitor 132) is between the fourth source/drain terminal 130 of the row select transistor and a body region of a first substrate 202. A first electrode 204 of the second capacitor 134 is coupled to the fourth source/drain terminal 130 by a first contact 206. An interconnect structure 208 further extends between and electrically couples the first electrode 204 and the first contact 206, resulting in coupling the first electrode 204 to the output node 128. A second electrode 210 of the second capacitor 134 is coupled to the first gate electrode 118 of the source follower transistor 116 by the interconnect structure 208 and a second contact 212, where the second electrode 210 is coupled to the floating diffusion node (see 106 of FIG. 1A). The interconnect structure 208 comprises one or more wire levels and one or more via levels forming a first conductive path 214 between the first gate electrode 118 and the second electrode 210 and a second conductive path 216 between the fourth source/drain terminal 130 and the first electrode 204. The interconnect structure 208 is surrounded by a plurality of interlayer dielectric layers 218. A first insulative layer 220 surrounds the first and second electrodes 204, 210 of the second capacitor 134.

Figure 3:
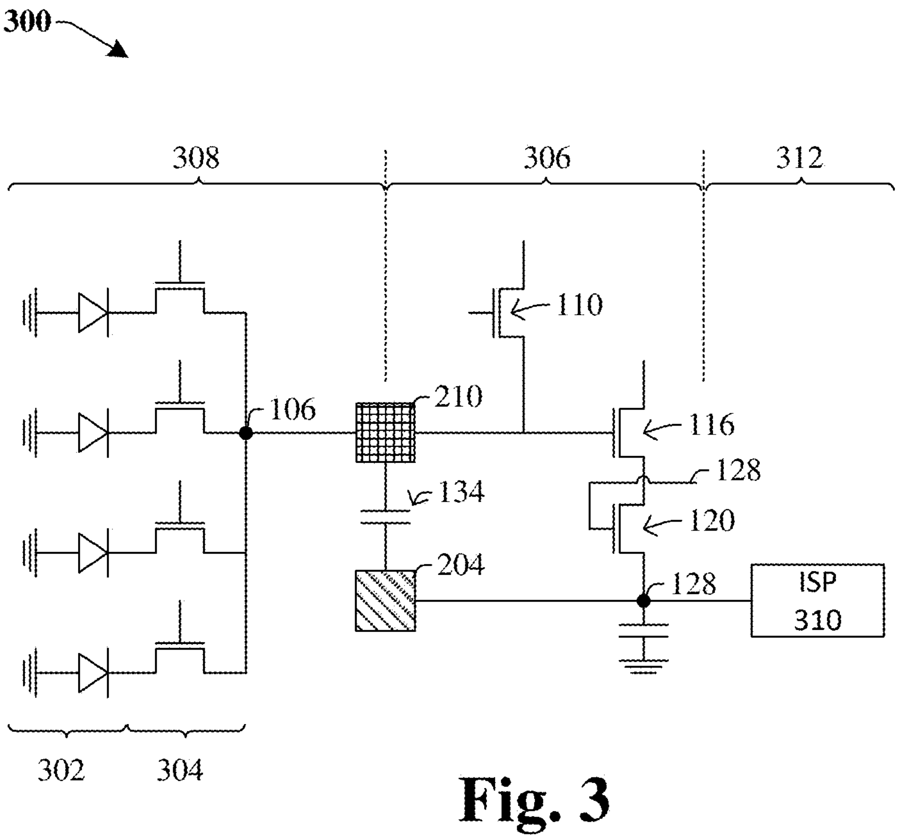
FIG. 3 illustrates a circuit schematic of some embodiments of an image sensor with a capacitor between the output node and the floating diffusion node with multiple photodetectors coupled to the floating diffusion node.

FIG. 3 illustrates a circuit schematic 300 of some embodiments of an image sensor with a capacitor between an output node and the floating diffusion node with multiple photodetectors coupled to the floating diffusion node.

In some embodiments, the pixel circuit 104 is formed across multiple different chips bonded together. In some embodiments, the reset transistor 110, the source follower transistor 116, and the row select transistor 120 are on a first chip 306. A plurality of photodetectors 302 are coupled to the floating diffusion node 106 by a plurality of transfer transistors 304 on a second chip 308. An ISP circuit 310 is on a third chip 312. The row select line 142 and the output line 140 are within the first chip 306. The output node 128 is on the first chip 306 and is electrically coupled to the third chip 312. In some embodiments, the first electrode 204 and the second electrode 210 of the second capacitor 134 are within bond layers between the second chip 308 and the first chip 306.

Figure 4:
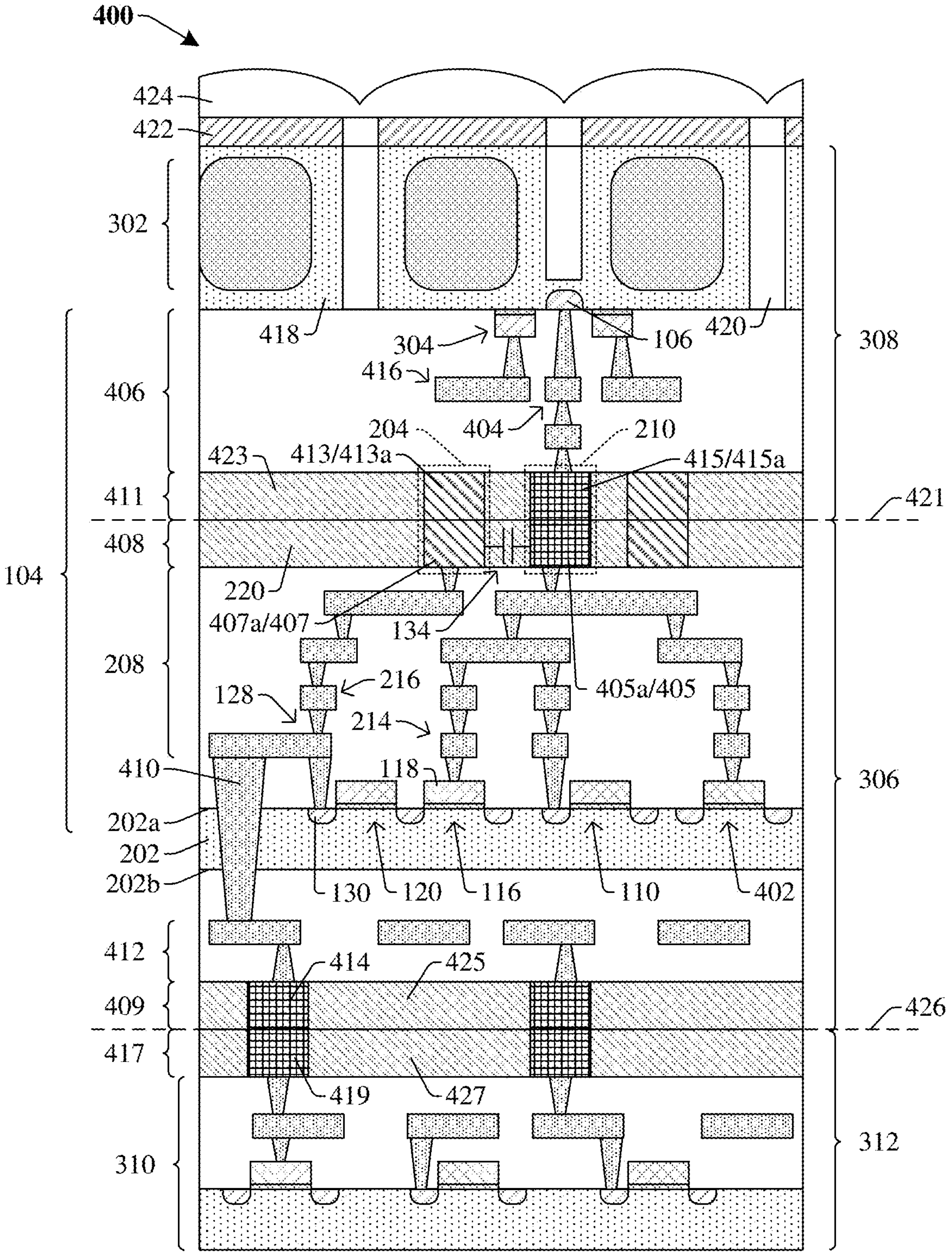
FIG. 4 illustrates a cross-sectional view of some embodiments of an image sensor with a shield structure and a metal bond pad configured to be a capacitor coupled between the output node and the floating diffusion node.

FIG. 4 illustrates a cross-sectional view 400 of some embodiments of an image sensor with a shield structure and a metal bond pad configured to be a capacitor coupled between an output node and the floating diffusion node.

In some embodiments, the first interconnect structure 208 is on a first side 202*a* of the first substrate 202 and comprises the first conductive path 214. The first conductive path 214 electrically couples the first gate electrode 118 of the source follower transistor 116 to the second electrode 210 of the second capacitor 134. The first conductive path 214 further is electrically coupled to the source/drain terminal 112 of the reset transistor 110 and a conversion gain circuit 402. The first conductive path 214 is coupled to the floating diffusion node 106. The conversion gain circuit 402 comprises one or more semiconductor devices configured to increase the conversion gain of the pixel circuit in a low information environment (e.g., imaging an area with a light level below a specified threshold).

The first conductive path 214 is coupled to a third conductive path 404 in a second interconnect structure 406 on the second chip 308. A first bond layer 408 of the first chip 306 and a second bond layer 411 of the second chip 308 mechanically couple the first chip 306 to the second chip 308. The second electrode 210 comprises the combination of a first metal bond pad 405*a* of a first plurality of metal bond pads 405 within the first bond layer 408 and a second metal bond pad 415*a* of a second plurality of metal bond pads 415 within the second bond layer 411. The second metal bond pad 415*a* is coupled to the first metal bond pad 405*a* at a first bond interface 421. The second electrode 210 electrically couples the first conductive path 214 to the third conductive path 404. The second electrode 210 is also referred to as the bond electrode. Further, a first insulative layer 220 of the first bond layer 408 is mechanically coupled to a second insulative layer 423 of the second bond layer 411. The second interconnect structure 406 further comprises one or more additional conductive paths 416 coupled to the plurality of transfer transistors 304. Separate conductive paths 416 for the plurality of transfer transistors 304 coupled to the floating diffusion node 106 results in the transfer of charge from individual photodetectors of the plurality of photodetectors 302 during operation so that the charge from individual photodetectors can be separately delivered to the pixel circuit 104.

The second conductive path 216 extends from the fourth source/drain terminal 130 of the row select transistor 120 to the first electrode 204. In some embodiments, the second conductive path 216 is the same as the output node 128. In some embodiments, the first electrode 204 surrounds the second electrode 210, increasing the surface area of the second capacitor 134 and insulating the second electrode 210 from electric fields caused by other metal bond pads of the first plurality of metal bond pads 405. The first electrode 204 comprises a combination of a first shield structure 407*a* of a first plurality of shield structures 407 and a second shield structure 413*a* of a second plurality of shield structures 413. The first electrode 204 is also referred to as the shield electrode. The first shield structure 407*a* is mechanically coupled to the second shield structure 413*a* of a second plurality of shield structures 413 at the first bond interface 421. The second shield structure 413*a* has a same layout as the first shield structure 407*a* (e.g., has a same length and width, and a same distance between inner sidewalls) to enhance the bond strength at the first bond interface 421. The combination of the first bond layer 408 and the second bond layer results in an increased surface area of inner sidewalls of the first electrode 204 and outer sidewalls of the second electrode 210. The increased surface area increases the capacitance of the second capacitor 134 without increasing the area used by the second capacitor 134 within the first or second interconnect structures 208, 406. That is, a thickness of the first electrode 204 and the second electrode 210 is greater than a second thickness of the wire levels of the interconnect structure, resulting in a greater capacitance between the first electrode and the second electrode than a capacitance that would be between wires in a same layout to that of the first electrode 204 and the second electrode 210.

The second conductive path 216 is also electrically coupled to the ISP circuit 310 on the third chip 312. The ISP circuit 310 is configured to process the signals passed to it from the plurality of pixel circuits (see 145 of FIG. 1C) in the image sensor in order to combine the signals into an image. The ISP circuit 310 comprises one or more correlated double sampling (CDS) circuits, analog to digital converter (ADC) circuits, and amplifier circuits. One or more through substrate vias (TSVs) 410 couple the first interconnect structure 208 to a third interconnect structure 412 on a second side 202*b* of the first substrate 202 opposite the first side 202*a*. In some embodiments, third interconnect structure 412 comprises one or more wire levels and one or more via levels that are electrically coupled to the third chip 312 by a third bond layer 409. The third bond layer 409 comprises a third plurality of metal bond pads 414 and a third insulative layer 425. The third bond layer 409 is electrically coupled to a fourth bond layer 417 of the third chip 312 at a second bond interface 426. A fourth plurality of metal bond pads 419 are mechanically and electrically coupled to the third plurality of metal bond pads 414. Further, a fourth insulative layer 427 is mechanically coupled to the third insulative layer 425. The third plurality of metal bond pads 414 and the fourth plurality of metal bond pads 419 electrically couple the third interconnect structure 412 to the ISP circuit 310.

The plurality of photodetectors 302 are positioned within a second substrate 418. A plurality of deep trench isolation (DTI) structures 420 extend around and isolate the plurality of photodetectors from each other. A plurality of color filters 422 and micro lenses 424 are positioned above the photodetectors 302, such that incoming light is filtered and directed towards the photodetectors 302 before entering the second substrate 418.

Figure 5A:
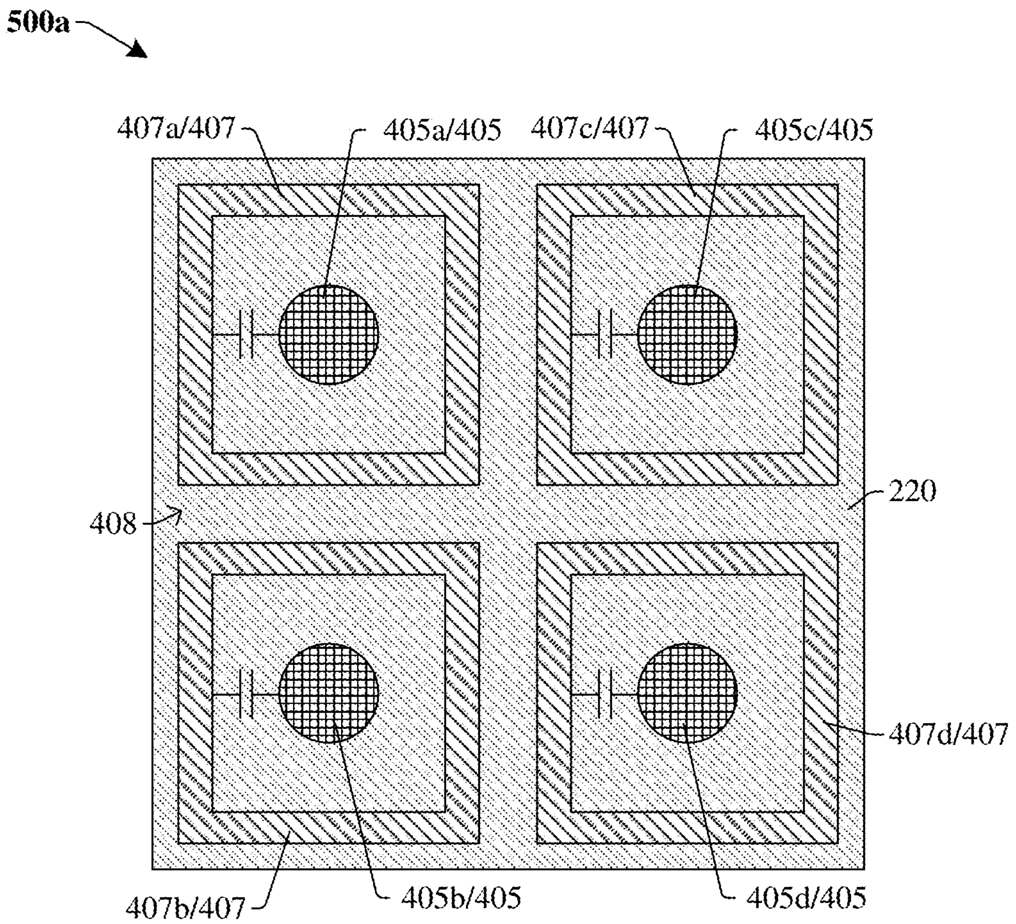
FIGS. 5A and 5B illustrate top down views of some embodiments of a plurality of shield structures and metal bond pads in an array of pixel circuits.
Figure 5B:
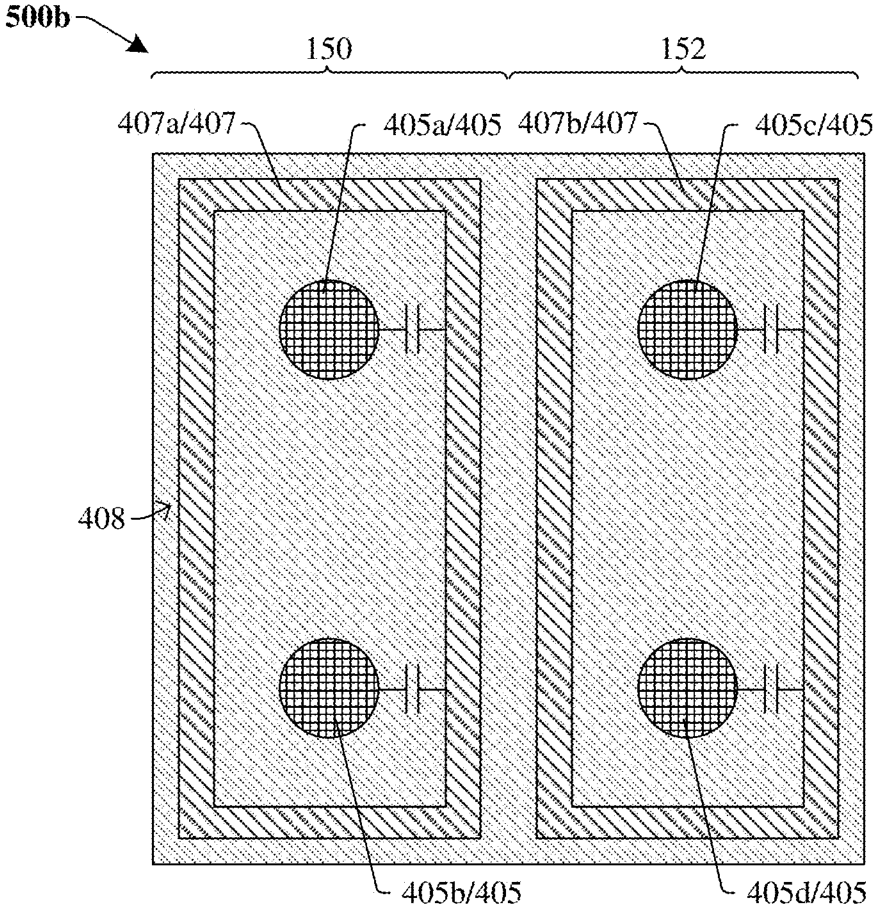

FIGS. 5A and 5B illustrate top down views 500*a*, 500*b* of some embodiments of a plurality of shield structures and metal bond pads in an array of pixel circuits.

As shown in the top down view 500*a* of FIG. 5A, the first bond layer 408 comprises the first insulative layer 220 surrounding a first plurality of metal bond pads 405 including the first metal bond pad 405*a* and a first plurality of shield structures 407 including the first shield structure 407*a*. In some embodiments, the first plurality of metal bond pads 405 are respectively surrounded by the first plurality of shield structures 407. For example, in an image sensor with four pixel circuits, the first metal bond pad 405*a* is surrounded by the first shield structure 407*a*, a second metal bond pad 405*b* is continuously surrounded by a second shield structure 407*b*, a third metal bond pad 405*c* is continuously surrounded by a third shield structure 407*c*, and a fourth metal bond pad 405*d* is continuously surrounded by a fourth shield structure 407*d*. The number of metal bond pads in the first plurality of metal bond pads 405 is equal to the number of shield structures in the first plurality of shield structures 407.

As shown in the top down view 500*b* of FIG. 5B, in other embodiments, the number of metal bond pads in the first plurality of metal bond pads 405 is greater than the number of shield structures in the first plurality of shield structures 407. The shield structures surround more than one metal bond pad within columns of the plurality of metal bond pads. For example, in an image sensor with four pixel circuits, the first metal bond pad 405*a* and the second metal bond pad 405*b* in the first column 150 are continuously surrounded by the first shield structure 407*a*, and the third metal bond pad 405*c* and fourth metal bond pad 405*d* in the second column 152 are surrounded by the second shield structure 407*b*. The output nodes (see 128 of FIG. 1C) of the plurality of pixel circuits in the first column 150 are coupled together by the output line (see 140 of FIG. 1C). As the output nodes (see 128 of FIG. 1C) are also coupled to the shield structures of the first plurality of shield structures 407 in the first column 150, the electrically coupled shield structures shown in FIG. 1A can be replaced by the shield structures shown in FIG. 1B without changing the electrical couplings of the circuit. Using the shield structures as shown in FIG. 5B reduces the footprint of the shield structures (e.g., the lateral area of the shield structure may be reduced). By removing portions of the shield structure from between the metal bond pads, the metal bond pads may be positioned closer together, reducing the footprint of the pixel circuits.

FIGS. 6-18 illustrate a series of cross-sectional views 600-1800 of some embodiments of a method of forming an image sensor with a capacitor between an output node and the floating diffusion node with multiple photodetectors coupled to the floating diffusion node. Although FIGS. 6-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
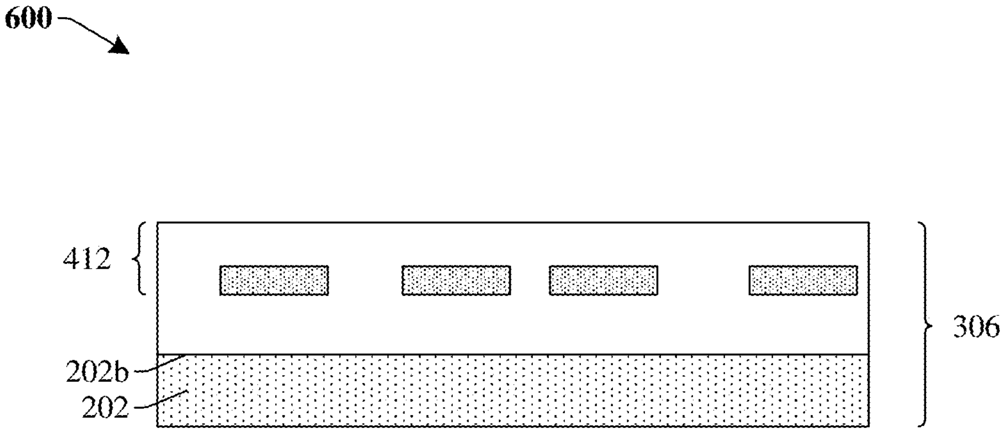
FIGS. 6-18 illustrate a series of cross-sectional views of some embodiments of a method of forming an image sensor with a capacitor between the output node and the floating diffusion node with multiple photodetectors coupled to the floating diffusion node.

As shown in the cross-sectional view 600 of FIG. 6, the third interconnect structure 412 is formed on the second side 202*b* of the first substrate 202 as part of the first chip 306. The third interconnect structure 412 comprises one or more wire levels and one or more via levels forming conductive paths over the first substrate 202. Further, a plurality of interlayer dielectric layers 218 are formed between forming wire levels and via levels of the third interconnect structure 412. In some embodiments, the third interconnect structure 412 comprises a conductive material, such as copper, aluminum, tungsten, a conductive metal alloy, or the like. In some embodiments, the plurality of interlayer dielectric layers 218 are or comprise an insulative material, such as silicon dioxide ($SiO_2$), silicon nitride ($Si_3N_4$), or the like. The third interconnect structure 412 is formed using one or more of a physical vapor deposition (PVD), atomic layer deposition (ALD), chemical vapor deposition (CVD), a damascene process, a dual damascene process, or the like.

Figure 7:
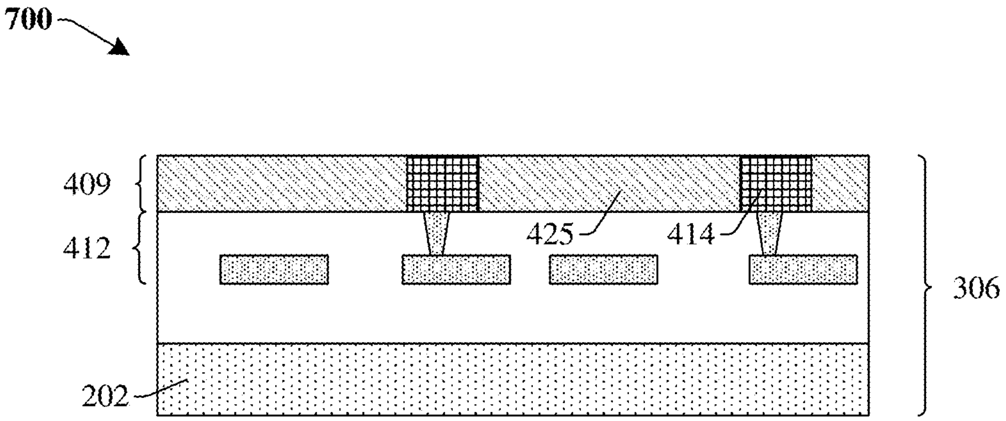

As shown in the cross-sectional view 700 of FIG. 7, in some embodiments, a third bond layer 409 is formed on the third interconnect structure 412. The third bond layer 409 comprises a third insulative layer 425 and a third plurality of metal bond pads 414. In some embodiments, the third plurality of metal bond pads 414 are or comprise one or more of aluminum, copper, aluminum copper, or the like. In some embodiments, the third insulative layer 425 is or comprises one or more of silicon dioxide ($SiO_2$), silicon nitride ($Si_3N_4$), or the like. The third insulative layer 425 is formed using one or more of PVD, ALD, CVD, or the like. The third plurality of metal bond pads 414 are formed using one or more of PVD, ALD, CVD, a damascene process, or the like. In some embodiments, the third plurality of metal bond pads 414 are formed concurrently with an underlying contact layer by using a dual damascene process.

Figure 8:
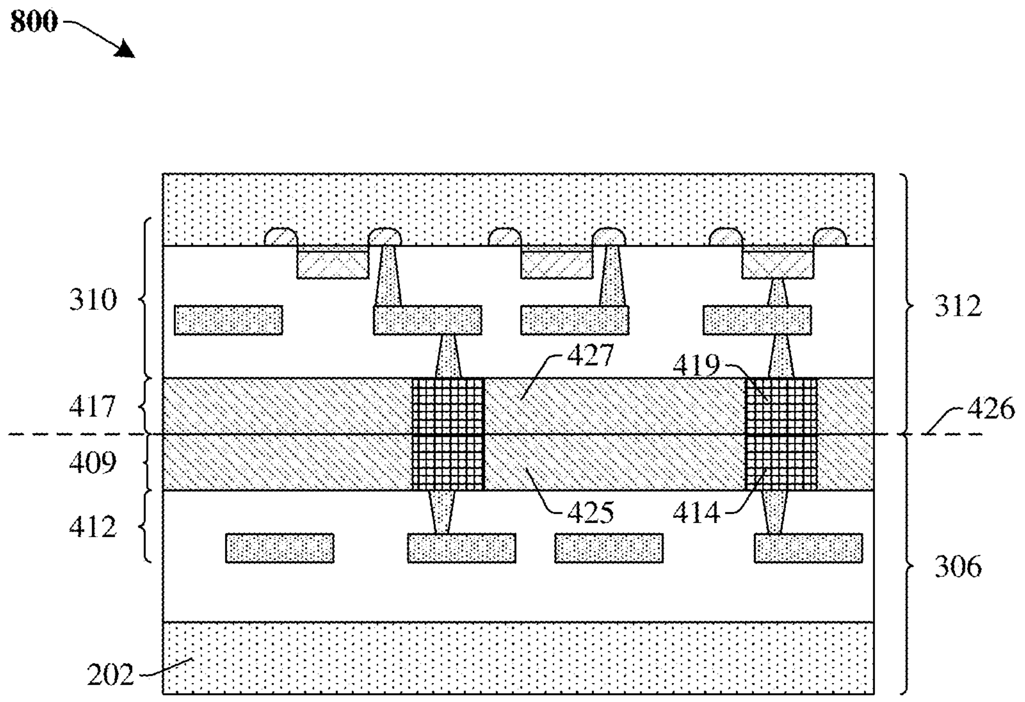

As shown in the cross-sectional view 800 of FIG. 8, the ISP circuit 310 is formed on the third chip 312 and the third chip 312 is bonded to the first chip 306 at the third bond layer 409. The ISP circuit 310 comprises one or more correlated double sampling (CDS) circuits, analog to digital converter (ADC) circuits, and amplifier circuits which comprise one or more transistors, passive circuit components, or other circuit components. Forming the ISP circuit 310 comprises using one or more of PVD, ALD, CVD, and implantation processes or the like to form the transistors and circuit components, as well as using one or more of PVD, ALD, CVD, damascene processes, or the like to form an overlying interconnect structure to form conductive paths between the circuit components and the transistors.

In some embodiments, the third chip 312 is coupled to the first chip 306 by forming the fourth bond layer 417 on the third chip 312 before bonding the third chip 312 to the third bond layer 409. The fourth insulative layer 427 is dielectrically bonded to the third insulative layer 425, and the fourth plurality of metal bond pads 419 are bonded to the third plurality of metal bond pads 414. The combination of using a dielectric-to-dielectric bond between insulative layers and a metal-to-metal bond between metal bond pads demonstrates a hybrid bond at the second bond interface 426. The dielectric-to-dielectric bond between insulative layers and a metal-to-metal bond between metal bond pads at the second bond interface 426 is formed by performing a pressure treatment to initially bond the fourth insulative layer 427 to the third insulative layer 425 and a subsequent anneal to strengthen the bond between the third and fourth insulative layers 425, 427, as well as forming the bond between the third and fourth pluralities of metal bond pads 414, 419. In other embodiments, a hybrid bond is not used to bond the first chip 306 to the third chip 312, and a different method of bonding the first chip 306 to the third chip 312 is performed.

Figure 9:
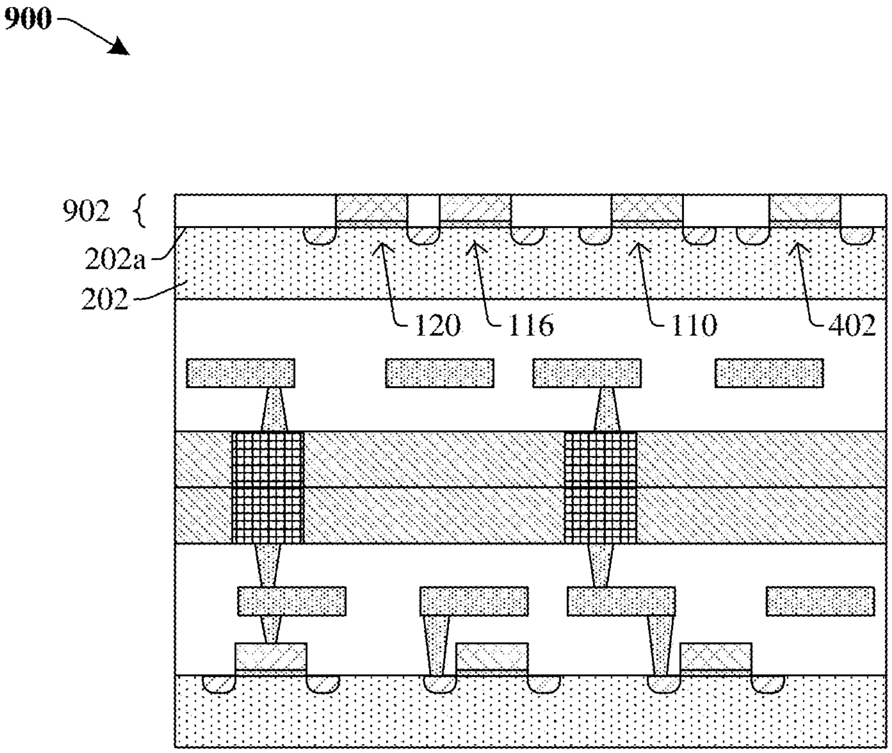

As shown in the cross-sectional view 900 of FIG. 9, a plurality of front end of line (FEOL) circuit components 902 are formed on the first side 202*a* of the first substrate 202. The plurality of FEOL circuit components 902 comprise reset transistors 110, components of the conversion gain circuit 402, source follower transistors 116, and row select transistors 120 of the plurality of pixel circuits. In some embodiments the plurality of FEOL circuit components 902 formed within the image sensor are a plurality of metal oxide semiconductor field effect transistor (MOSFET) devices. In some embodiments, the plurality of FEOL circuit components 902 are formed using one or more PVD, ALD, CVD, or implantation processes.

Figure 10:
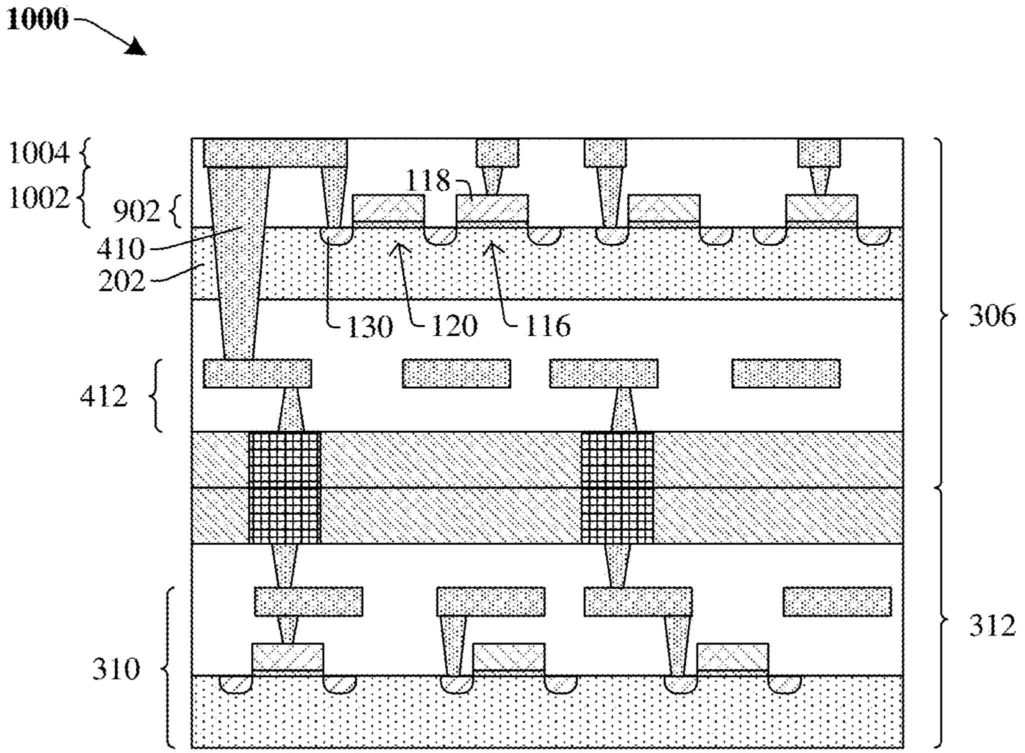

As shown in the cross-sectional view 1000 of FIG. 10, contacts 1002, including the first contact 206 and the second contact 212, and an overlying wire layer 1004 are formed over the first side of the first substrate 202. The first contact 206 is coupled to the fourth source/drain terminal 130 of the row select transistor 120, and the second contact 212 is coupled to a first gate electrode 118 of the source follower transistor 116. The contacts 1002 are coupled to the plurality of FEOL circuit components 902 to connect them to the first interconnect structure (see 208 of FIG. 11) to be formed hereafter. Further, the TSV 410 is formed, coupling the fourth source/drain terminal 130 of the row select transistor 120 (via the overlying wire layer 1004) to the third interconnect structure 412 and the ISP circuit 310. In some embodiments, the contacts 1002, the TSV, and the overlying wire layer 1004 are formed using one or more of etching, CVD, ALD, PVD, and planarization (e.g., chemical mechanical planarization) processes. In some embodiments, the contacts 1002 and the overlying wire layer 1004 are formed concurrently.

Figure 11:
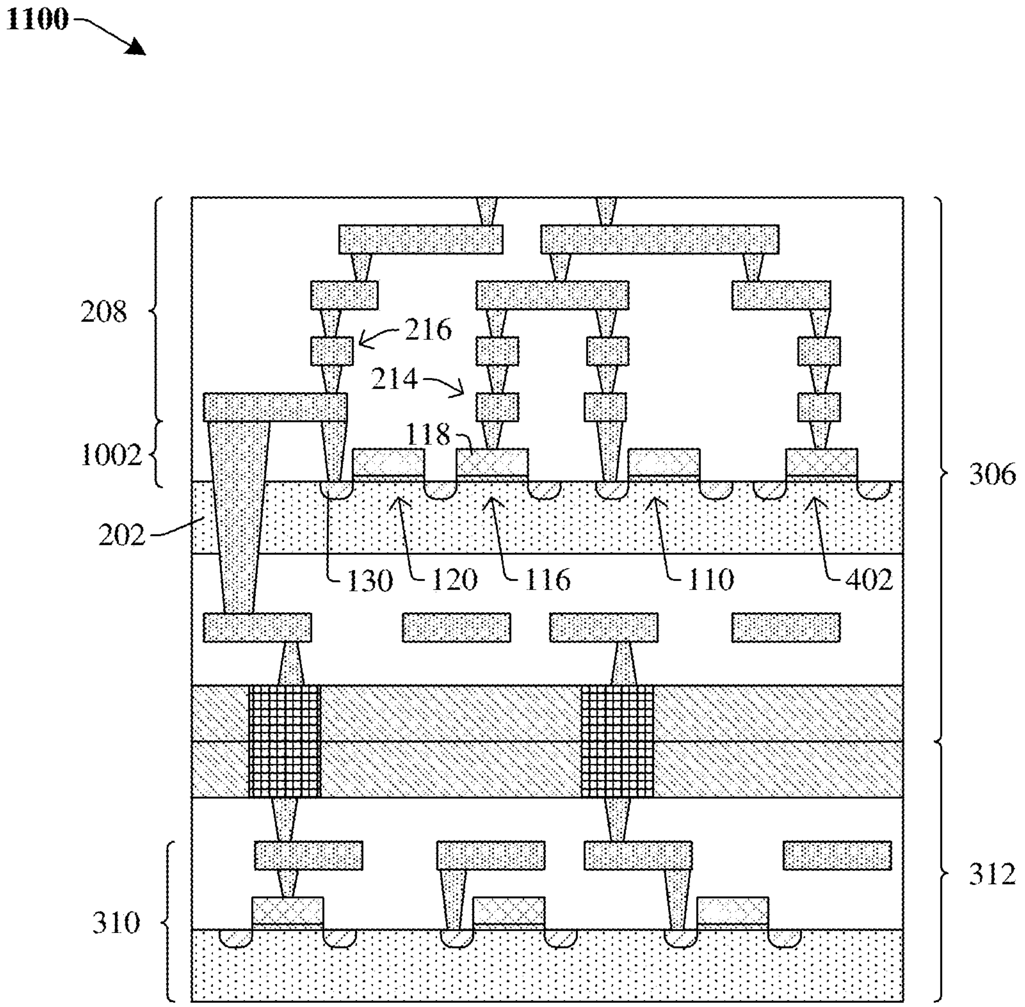

As shown in the cross-sectional view 1100 of FIG. 11, the first interconnect structure 208 is formed over the contacts 1002. The first interconnect structure 208 comprises a plurality of wire levels and a plurality of via levels arranged to form at least the first conductive path 214 and the second conductive path 216. The first conductive path 214 electrically couples the first gate electrode 118 of the source follower transistor 116, a source/drain terminal of the reset transistor 110, and a transistor of the conversion gain circuit 402, and extends to an uppermost wire level of the first interconnect structure. The second conductive path 216 is coupled to the fourth source/drain terminal 130 of the row select transistor 120 and the ISP circuit 310, and extends to an uppermost wire level of the first interconnect structure 208. In some embodiments, the overlying wire layer (see 1004 of FIG. 10) is part of the first interconnect structure 208.

Figure 12:
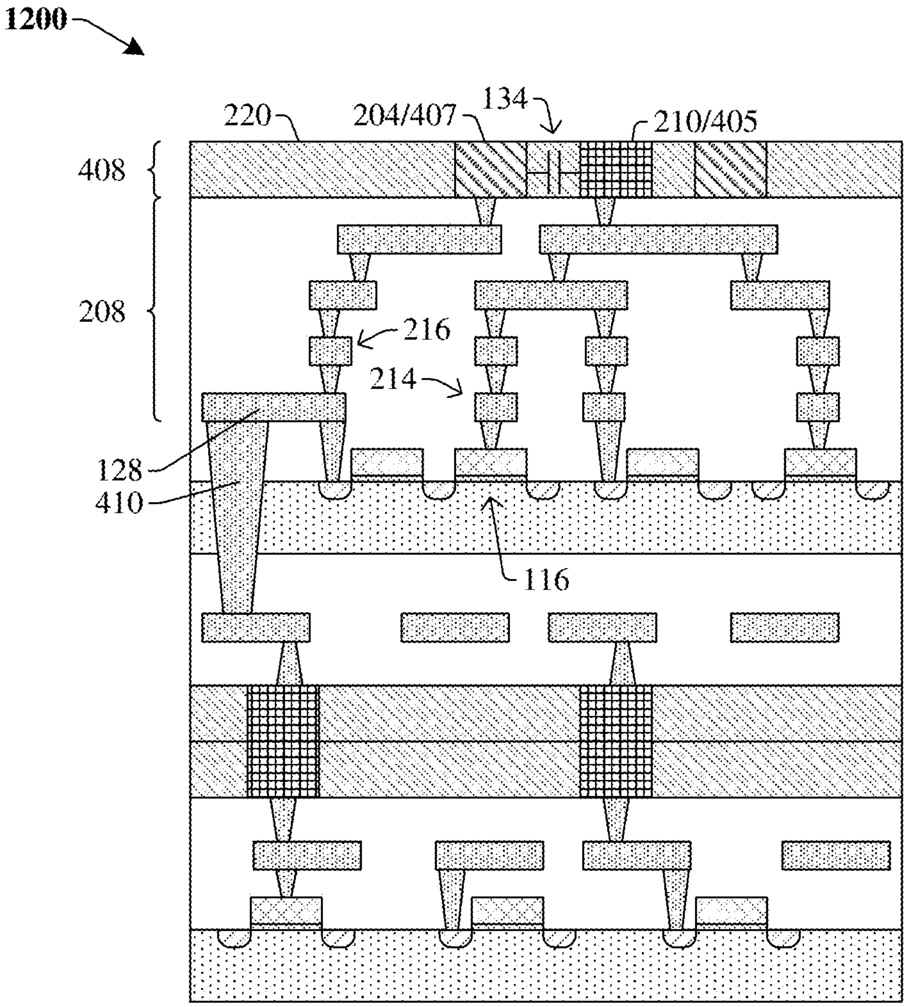

As shown in the cross-sectional view 1200 of FIG. 12, the first bond layer 408 is formed over and coupled to the first interconnect structure 208. The first bond layer 408 comprises a first insulative layer 220, a first plurality of metal bond pads 405 (including the second electrode 210) and a first plurality of shield structures 407 (including the first electrode 204), as shown in the top layouts of FIGS. 5A and 5B. The spacing of the first plurality of metal bond pads 405 from the first plurality of shield structures 407 form a plurality of capacitors including the second capacitor 134. The capacitance of the plurality of capacitors is based on both a distance between opposing faces of the first plurality of metal bond pads 405 (e.g., outer sidewalls of the first plurality of metal bond pads 405) and the first plurality of shield structures 407 (e.g., inner sidewalls of the first plurality of shield structures 407) and a surface area of the opposing faces of the first plurality of metal bond pads 405 and the first plurality of shield structures 407. The surface area of the opposing faces is increased when the second bond layer (see 411 of FIG. 4) is bonded to the first bond layer 408 (see FIG. 16). The first plurality of shield structures 407 are coupled to the output nodes 128 of the pixel circuits (see 104 of FIG. 1A) by the second conductive paths 216 in the first interconnect structure 208. The first plurality of metal bond pads 405 are coupled to the source follower transistors 116 by the first conductive paths 214.

The first plurality of metal bond pads 405 are or comprise one or more of aluminum, copper, aluminum copper, or the like. The first insulative layer 220 is or comprises one or more of silicon dioxide ($SiO_2$), silicon nitride ($Si_3N_4$), or the like. The first insulative layer 220 is formed using one or more of PVD, ALD, CVD, etching, or the like. The first plurality of metal bond pads 405 are formed using one or more of PVD, ALD, CVD, a damascene process, or the like. In some embodiments, the first plurality of metal bond pads 405 are formed concurrently with an underlying contact layer by using a dual damascene process.

Figure 13:
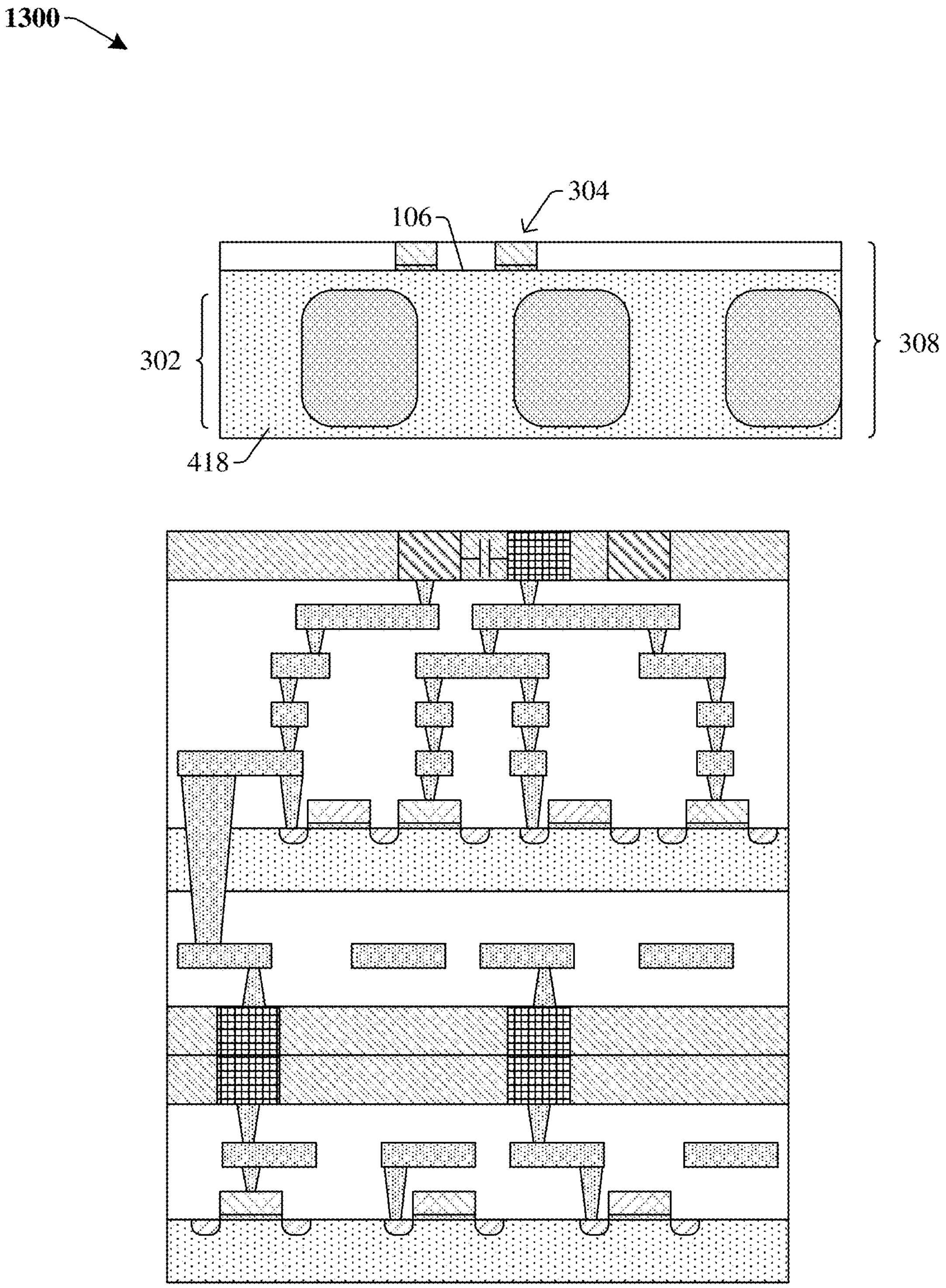

As shown in the cross-sectional view 1300 of FIG. 13, the plurality of transfer transistors 304, the plurality of photodetectors 302, and the floating diffusion node 106 are formed on the second substrate 418 of the second chip 308. The floating diffusion node 106 and the plurality of photodetectors 302 are formed using implantation processes to implant n-type dopants into the second substrate 418. In some embodiments, the plurality of transfer transistors 304 are formed using one or more of PVD, ALD, CVD, and etching processes.

Figure 14:
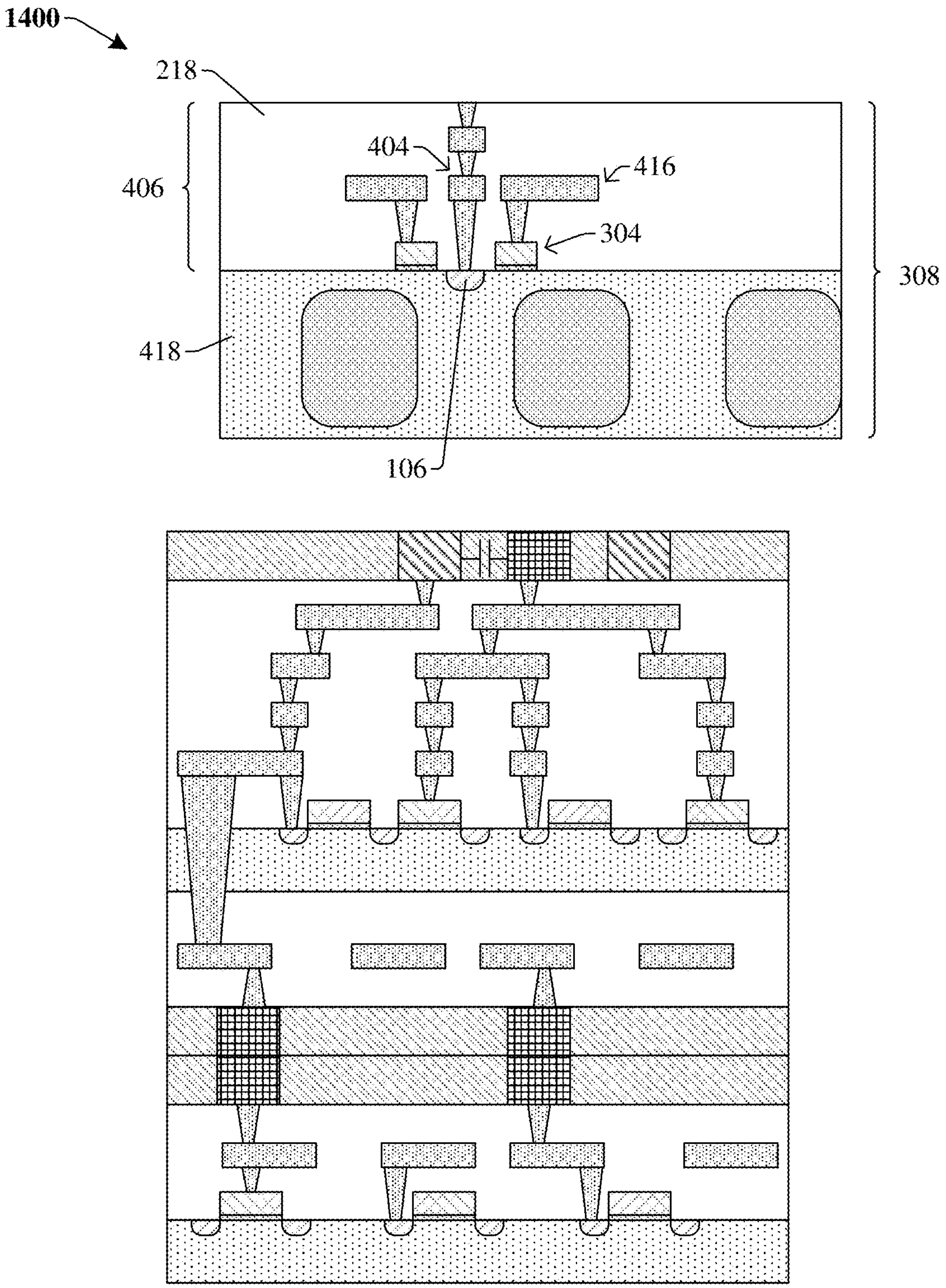

As shown in the cross-sectional view 1400 of FIG. 14, the second interconnect structure 406 is formed over the second substrate 418. The second interconnect structure 406 forms a third conductive path 404 coupled to the floating diffusion node 106 and additional conductive paths coupled to the gate electrodes of the transfer transistors 304. The second interconnect structure 406 comprises a plurality of wire levels and a plurality of via levels. A plurality of interlayer dielectric layers 218 surround the second interconnect structure 406 and are formed between the formation of individual wire levels. In some embodiments, the second interconnect structure 406 comprises a conductive material, such as copper, aluminum, copper, tungsten, a conductive metal alloy, or the like. In some embodiments, the plurality of interlayer dielectric layers 218 are or comprise an insulative material, such as silicon dioxide ($SiO_2$), silicon nitride ($Si_3N_4$), or the like. The second interconnect structure 406 is formed using one or more of a PVD, ALD, CVD, damascene processes, dual damascene processes, or the like.

Figure 15:
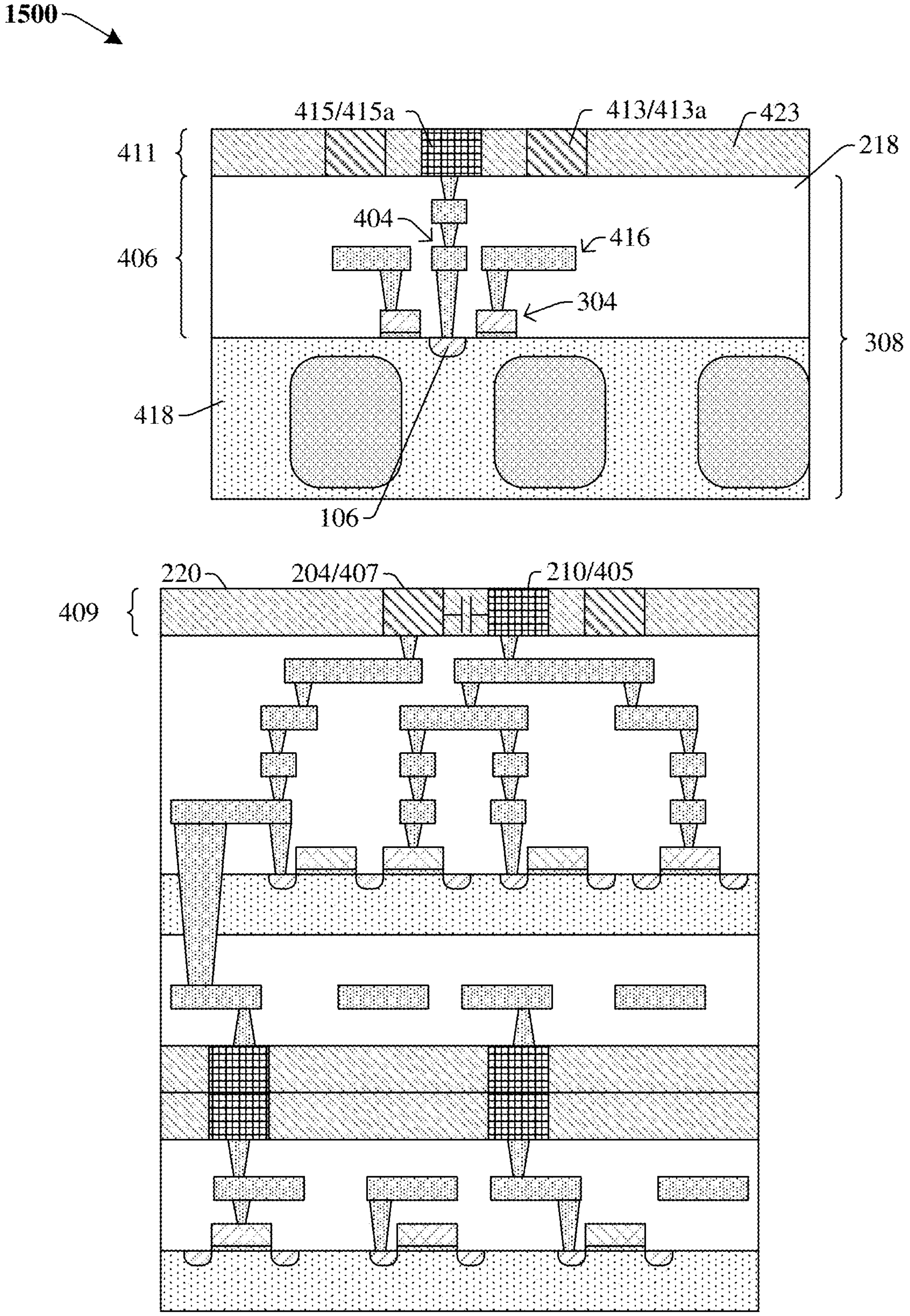

As shown in the cross-sectional view 1500 of FIG. 15, in some embodiments, a second bond layer 411 is formed over the second interconnect structure 406 on the second chip 308. The second bond layer 411 comprises a second insulative layer 423 of a same material as the first insulative layer 220, a second plurality of shield structures 413 comprising a same material as the first plurality of shield structures 407, and a second plurality of metal bond pads 415 that comprise a same material as the first plurality of metal bond pads 405. The second plurality of metal bond pads 415 are arranged to meet and couple to exposed faces of the first plurality of metal bond pads 405 during a bonding process described hereafter (see FIG. 16). The second plurality of shield structures 413 are arranged to meet and couple to exposed faces of the first plurality of shield structures 407 during the bonding process described hereafter (see FIG. 16). In some embodiments, the second plurality of metal bond pads 415 has a same top geometry as the first plurality of metal bond pads (see 405 of FIG. 4), and wherein the second plurality of shield structures 413 has a same top geometry as the first plurality of shield structures (see 407 of FIG. 4). In other embodiments, the second bond layer 411 is omitted.

Figure 16:
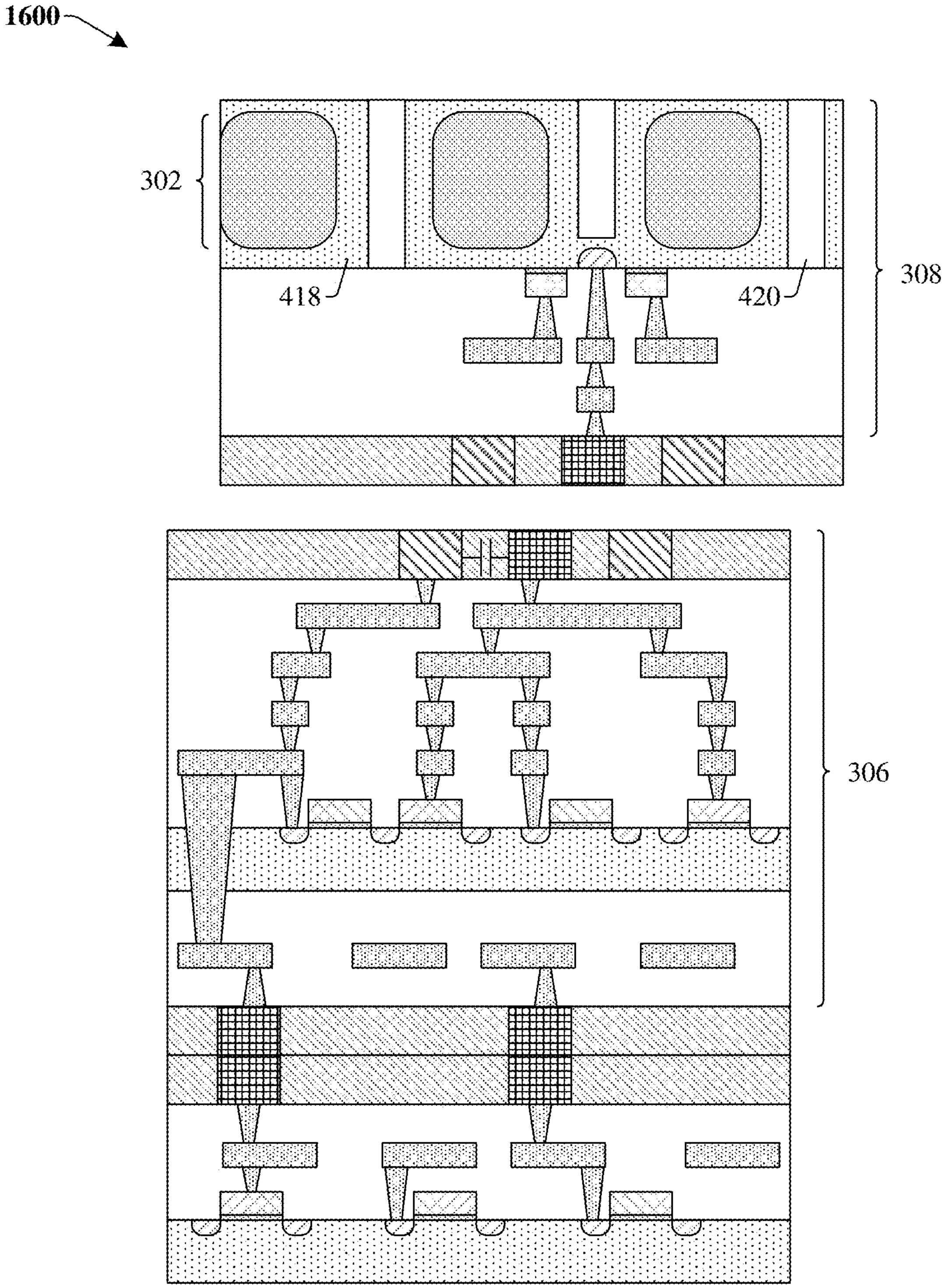

As shown in the cross-sectional view 1600 of FIG. 16, the plurality of DTI structures 420 are formed within the second substrate 418 around the plurality of photodetectors 302. In some embodiments, the plurality of DTI structures 420 are formed using one or more of PVD, ALD, CVD, or etching processes. In some embodiments, the plurality of DTI structures 420 are formed after the second chip 308 is bonded to the first chip 306 (e.g., subsequent to the steps shown in FIG. 17).

Figure 17:
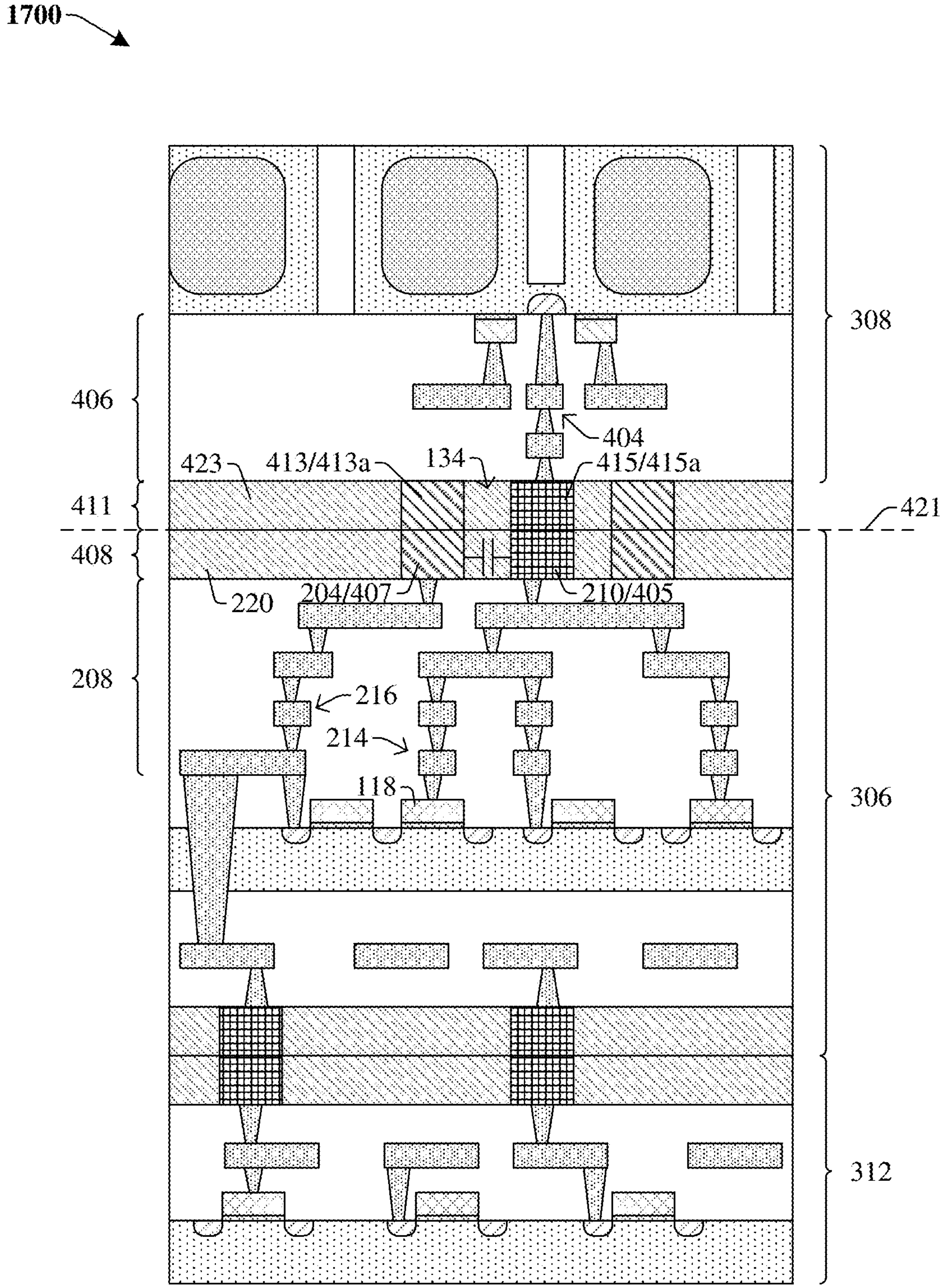

As shown in the cross-sectional view 1700 of FIG. 17, the second chip 308 is bonded to the first chip 306, such that the third conductive path 404 is electrically coupled to the first conductive path 214 by the first plurality of metal bond pads 405 (including the second electrode 210) and the second plurality of metal bond pads 415. The second chip 308 is bonded to the first chip 306 using a combination of a dielectric-to-dielectric bond between insulative layers and a metal-to-metal bond between metal bond pads. The second insulative layer 423 and the first insulative layer 220 are bonded together using a pressure treatment and a subsequent anneal. Further, the first plurality of metal bond pads 405 bond to the second plurality of metal bond pads 415 and the first plurality of shield structures 407 bond to the second plurality of shield structures 413 during the pressure treatment and subsequent anneal. Bonding the first bond layer 408 to the second bond layer 411 results in the second capacitor 134 having an increased area, increasing the capacitance of the second capacitor 134.

Figure 18:
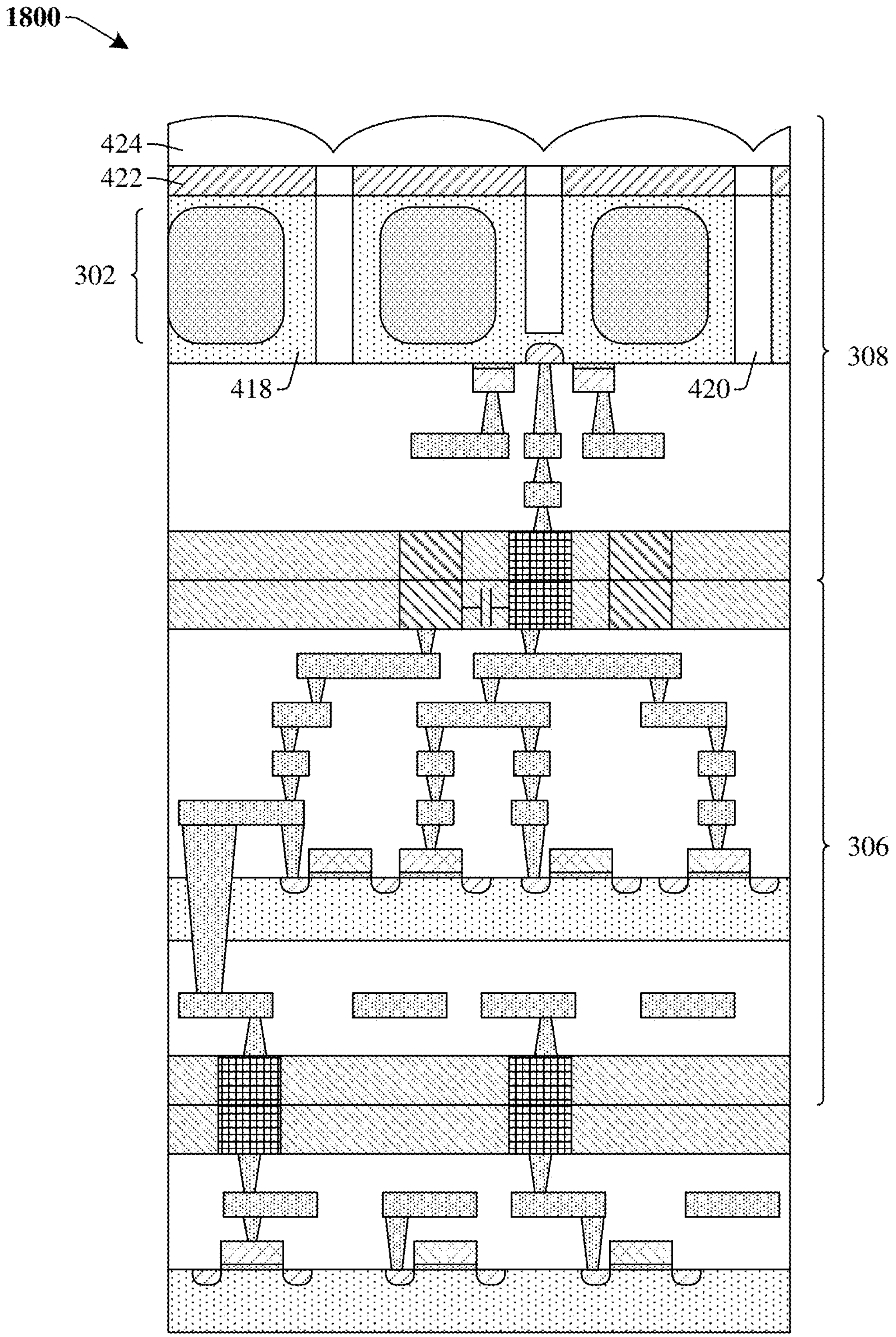

As shown in the cross-sectional view 1800 of FIG. 18, in some embodiments, the plurality of color filters 422 and the plurality of micro lenses 424 are formed on the second substrate 418 over the photodetectors 302. In some embodiments, the plurality of color filters 422 and the plurality of micro lenses 424 are formed before second chip 308 is bonded to the first chip 306, subsequent to the forming of the plurality of photodetectors 302 and the plurality of DTI structures 420. In some embodiments, the plurality of color filters 422 and the plurality of micro lenses 424 are centered on individual photodetectors of the plurality of photodetectors 302, such that the plurality of micro lenses 424 direct light towards the photodetectors 302. In other embodiments, the plurality of micro lenses 424 are offset from the center of individual photodetectors based on the position of the individual photodetectors in the photodetector array. For example, in some embodiments, individual photodetectors near a center of the photodetector array will have microlenses closer to being centered on the individual photodetectors, while individual photodetectors near an outer edge of the array will have microlenses with a greater offset from being centered on the individual photodetectors, to more effectively bend the incoming light towards the individual photodetectors.

Figure 19:
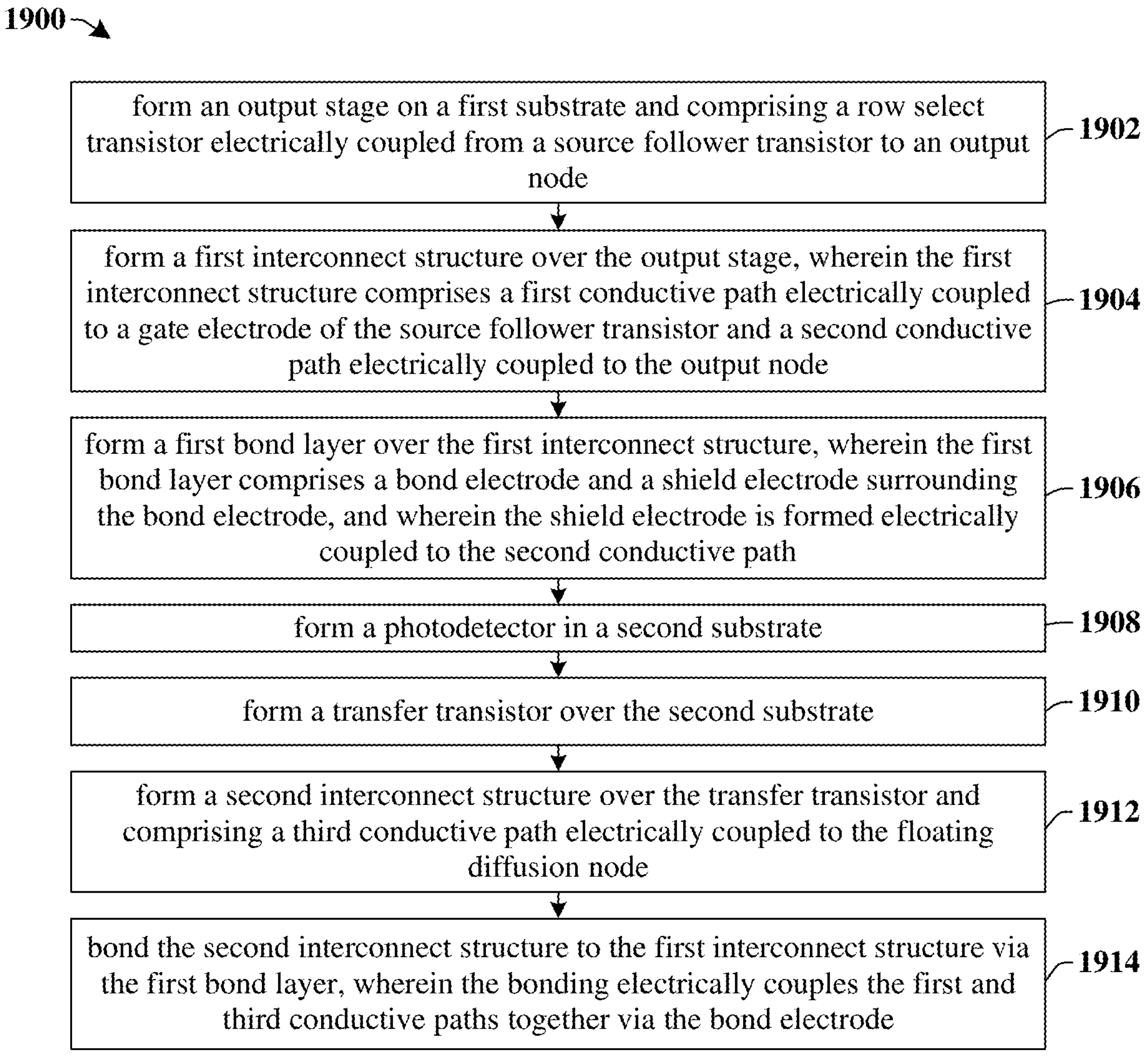
FIG. 19 illustrates a flowchart of some embodiments of a method of forming an image sensor with a capacitor between the output node and the floating diffusion node.

FIG. 19 illustrates a flowchart 1900 of some embodiments of a method of forming an image sensor with a capacitor between an output node and a floating diffusion node. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1902, an output stage is formed on a first substrate and comprising a row select transistor electrically coupled from a source follower transistor to an output node. An example of a drawing illustrating this step can be found, for example, in FIG. 9.

At 1904, a first interconnect structure is formed over the output stage, wherein the first interconnect structure comprises a first conductive path electrically coupled to a gate electrode of the source follower transistor and a second conductive path electrically coupled to the output node. An example of a drawing illustrating this step can be found, for example, in FIGS. 10-11.

At 1906, a first bond layer is formed over the first interconnect structure, wherein the first bond layer comprises a bond electrode and a shield electrode surrounding the bond electrode, and wherein the shield electrode is formed electrically coupled to the second conductive path. An example of a drawing illustrating this step can be found, for example, in FIG. 12.

At 1908, a photodetector is formed in a second substrate. An example of a drawing illustrating this step can be found, for example, in FIG. 13.

At 1910, a transfer transistor is formed over the second substrate, wherein the transfer transistor is electrically coupled from the photodetector to a floating diffusion node. An example of a drawing illustrating this step can be found, for example, in FIG. 13.

At 1912, a second interconnect structure is formed over the transfer transistor and comprising a third conductive path electrically coupled to the floating diffusion node. An example of a drawing illustrating this step can be found, for example, in FIGS. 13-14.

At 1914, the second interconnect structure is bonded to the first interconnect structure via the first bond layer, wherein the bonding electrically couples the first and third conductive paths together via the bond electrode. An example of a drawing illustrating this step can be found, for example, in FIG. 17.

Some embodiments relate to an image sensor, including: a photodetector; and a pixel circuit, comprising: a floating diffusion node and an output node; a transfer transistor electrically coupled from the floating diffusion node to the photodetector; a source follower transistor comprising a gate electrode electrically coupled to the floating diffusion node; a row select transistor electrically coupled from a source/drain region of the source follower transistor to the output node; and a capacitor electrically coupled from the output node to the floating diffusion node. In some embodiments, the image sensor further includes: a first integrated circuit (IC) chip accommodating the photodetector, the floating diffusion node, and the transfer transistor; and a second IC chip bonded to the first IC chip at an interface and accommodating the source follower transistor, the row select transistor, and the output node, where the capacitor comprises individual electrodes at the interface. In some embodiments, the interface comprises a metal-to-metal interface and a dielectric-to-dielectric interface. In some embodiments, the image sensor further includes a third IC chip bonded to the second IC chip and separated from the first IC chip by the second IC chip, where the third IC chip comprises an image signal processor electrically coupled to the output node. In some embodiments, the capacitor comprises a first electrode and a second electrode respectively electrically coupled to the output node and the floating diffusion node, and where the first electrode extends in a closed path around the second electrode. In some embodiments, the photodetector and the pixel circuit form a pixel, which repeats in a plurality of rows and a plurality of columns, and where the image sensor further includes: an output line elongated along a first column of the plurality of columns and electrically coupled to the output node of each pixel in the first column. In some embodiments, the source follower transistor has a gain less than 1.

Other embodiments relate to an image sensor, including: a source follower transistor and a row select transistor on a first substrate, wherein the row select transistor is electrically coupled from the source follower transistor to an output node; a photodetector and a floating diffusion node in a second substrate; a transfer transistor on the second substrate and electrically coupled from the photodetector to the floating diffusion node; a first interconnect structure and a second interconnect structure between the first and second substrates; and a bond structure between the first and second interconnect structures, wherein the bond structure comprises a shield electrode and a bond electrode surrounding the shield electrode; wherein the first interconnect structure electrically couples the shield electrode to the output node, and wherein the second interconnect structure electrically couples the bond electrode to the floating diffusion node. In some embodiments, the first interconnect structure comprises a plurality of wire levels and a plurality of via levels alternatingly stacked from the bond structure towards the first substrate, and wherein the shield electrode has a thickness that is greater than a thickness that a wire level of the plurality of wire levels has. In some embodiments, the bond electrode and the shield electrode form a capacitance negating parasitic capacitance at the output node. In some embodiments, the image sensor further includes: a plurality of pixels in a plurality of rows and a plurality of columns, where the plurality of pixels comprise a first pixel formed in part by the photodetector, the row select transistor, and the source follower transistor, and where the bond structure comprises a plurality of bond electrodes, including the bond electrode, individual to the plurality of pixels. In some embodiments, the shield electrode extends in a closed path around the bond electrode to separate the bond electrode from each other bond electrode of the plurality of bond electrodes. In some embodiments, the first pixel is in a first column of the plurality of columns, and where the shield electrode extends in a closed path around multiple bond electrodes of the plurality of bond electrodes that correspond to pixels in the first column.

Yet other embodiments relate to a method of forming an image sensor, including: forming an output stage on a first substrate and comprising a row select transistor electrically coupled from a source follower transistor to an output node; forming a first interconnect structure over the output stage, where the first interconnect structure comprises a first conductive path electrically coupled to a gate electrode of the source follower transistor and a second conductive path electrically coupled to the output node; forming a first bond layer over the first interconnect structure, where the first bond layer comprises a bond electrode and a shield electrode surrounding the bond electrode, and where the shield electrode is formed electrically coupled to the second conductive path; forming a photodetector in a second substrate; forming a transfer transistor over the second substrate, where the transfer transistor is electrically coupled from the photodetector to a floating diffusion node; forming a second interconnect structure over the transfer transistor and comprising a third conductive path electrically coupled to the floating diffusion node; and bonding the second interconnect structure to the first interconnect structure via the first bond layer, where the bonding electrically couples the first and third conductive paths together via the bond electrode. In some embodiments, the bond electrode and the shield electrode form a capacitor electrically coupled from the output node to the floating diffusion node. In some embodiments, the method further comprises: forming a second bond layer over the second interconnect structure, where the second bond layer comprises an additional bond electrode and an additional shield electrode, where the additional bond electrode is electrically coupled to the third conductive path, and where the additional bond electrode and the additional shield electrode are bonded respectively to the bond electrode and the shield electrode during the bonding of the second interconnect structure to the first interconnect structure. In some embodiments, the additional bond electrode has a same top geometry as the bond electrode, and wherein the additional shield electrode has a same top geometry as the shield electrode. In some embodiments, the method further comprises forming a conversion gain circuit concurrently with forming the output stage and comprising a first conversion gain transistor, where the first conductive path is electrically coupled to a gate electrode of the first conversion gain transistor. In some embodiments, the method further comprises: forming a third interconnect structure on a backside of the first substrate, where the output stage and the first interconnect structure are formed on a frontside of the first substrate, opposite the backside of the first substrate; and forming a through substrate via (TSV) extending through the first substrate to the third interconnect structure, wherein the first interconnect structure is formed electrically coupled to the TSV. In some embodiments, the method further comprises bonding an integrated circuit (IC) chip to the third interconnect structure on the backside of the first substrate, where the IC chip comprises an image signal processing circuit.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
- a photodetector;
- a pixel circuit, comprising:
  - a floating diffusion node and an output node;
  - a transfer transistor electrically coupled from the floating diffusion node to the photodetector;
  - a source follower transistor comprising a gate electrode electrically coupled to the floating diffusion node;
  - a row select transistor electrically coupled from a source/drain region of the source follower transistor to the output node; and
  - a capacitor electrically coupled from the output node to the floating diffusion node;
- a first integrated circuit (IC) chip accommodating the source follower transistor, the row select transistor, and the output node; and
- a second IC chip bonded to the first IC chip at an interface and accommodating the photodetector, the floating diffusion node, and the transfer transistor, wherein the capacitor comprises individual electrodes at the interface.

2. The device according to claim 1, wherein the interface comprises a metal-to-metal interface and a dielectric-to-dielectric interface.

3. The device according to claim 1, further comprising:
- a third IC chip bonded to the first IC chip and separated from the second IC chip by the first IC chip, wherein the third IC chip comprises an image signal processor electrically coupled to the output node.

4. The device according to claim 1, wherein the individual electrodes of the capacitor comprise a first electrode and a second electrode electrically coupled respectively to the output node and the floating diffusion node, and wherein the first electrode extends in a closed path around the second electrode.

5. The device according to claim 1, wherein the photodetector and the pixel circuit form a pixel, wherein the device further comprises a plurality of additional pixels in a plurality of rows and a plurality of columns, and wherein the device further comprises:
- an output line elongated along a first column of the plurality of columns and electrically coupled to the output node of each pixel in the first column.

6. The device according to claim 1, wherein the source follower transistor has a gain less than 1.

7. A device, comprising:
- a source follower transistor and a row select transistor on a first substrate, wherein the row select transistor is electrically coupled between the source follower transistor and an output node;
- a photodetector and a floating diffusion node in a second substrate;
- a transfer transistor on the second substrate and electrically coupled between the photodetector and the floating diffusion node;
- a first interconnect structure and a second interconnect structure between the first and second substrates; and
- a bond structure between the first and second interconnect structures, wherein the bond structure comprises a bond electrode and a shield electrode surrounding the bond electrode;
- wherein the first interconnect structure electrically couples the shield electrode to the output node, and wherein the second interconnect structure electrically couples the bond electrode to the floating diffusion node.

8. The device according to claim 7, wherein the first interconnect structure comprises a plurality of wire levels and a plurality of via levels alternatingly stacked from the bond structure towards the first substrate, and wherein the shield electrode has a thickness that is greater than a thickness of a wire level of the plurality of wire levels.

9. The device according to claim 7, wherein the bond electrode and the shield electrode form a capacitor coupled between the source follower transistor and the output node.

10. The device according to claim 7, further comprising:
- a plurality of pixels in a plurality of rows and a plurality of columns, wherein the plurality of pixels comprise a first pixel formed in part by the photodetector, the row select transistor, and the source follower transistor, and wherein the bond structure comprises a plurality of bond electrodes comprising the bond electrode and additional bond electrodes.

11. The device according to claim 10, wherein the shield electrode extends in a closed path around the bond electrode to separate the bond electrode from the additional bond electrodes.

12. The device according to claim 10, wherein the first pixel is in a first column of the plurality of columns, and wherein the shield electrode extends in a closed path around multiple bond electrodes of the plurality of bond electrodes that correspond to pixels in the first column.

13. A method of forming a device, comprising:

forming an output stage on a first substrate and comprising a row select transistor electrically coupled from a source follower transistor to an output node;

forming a first interconnect structure over the output stage, wherein the first interconnect structure comprises a first conductive path electrically coupled to a gate electrode of the source follower transistor and a second conductive path electrically coupled to the output node;

forming a first bond layer over the first interconnect structure, wherein the first bond layer comprises a bond electrode and a shield electrode surrounding the bond electrode, and wherein the shield electrode is electrically coupled to the second conductive path;

forming a photodetector in a second substrate;

forming a transfer transistor over the second substrate, wherein the transfer transistor is electrically coupled from the photodetector to a floating diffusion node;

forming a second interconnect structure over the transfer transistor and comprising a third conductive path electrically coupled to the floating diffusion node; and bonding the second interconnect structure to the first interconnect structure via the first bond layer, wherein the bonding electrically couples the first and third conductive paths together via the bond electrode.

14. The method according to claim 13, wherein the bond electrode and the shield electrode form a capacitor electrically coupled from the output node to the floating diffusion node.

15. The method according to claim 13, further comprising:

forming a second bond layer over the second interconnect structure, wherein the second bond layer comprises an additional bond electrode and an additional shield electrode, wherein the additional bond electrode is electrically coupled to the third conductive path, and wherein the additional bond electrode and the additional shield electrode are bonded respectively to the bond electrode and the shield electrode during the bonding of the second interconnect structure to the first interconnect structure.

16. The method according to claim 15, wherein after forming the second bond layer, the additional shield electrode is isolated from the first interconnect structure by a dielectric.

17. The method according to claim 15, wherein the additional bond electrode has the same top geometry as the bond electrode, and wherein the additional shield electrode has the same top geometry as the shield electrode.

18. The method according to claim 13, further comprising:

forming a conversion gain circuit concurrently with forming the output stage and comprising a first conversion gain transistor, wherein the first conductive path is electrically coupled to a gate electrode of the first conversion gain transistor.

19. The method according to claim 13, further comprising:

forming a third interconnect structure on a backside of the first substrate, wherein the output stage and the first interconnect structure are formed on a frontside of the first substrate, opposite the backside of the first substrate; and forming a through substrate via (TSV) extending through the first substrate to the third interconnect structure, wherein the first interconnect structure is formed electrically coupled to the TSV.

20. The method according to claim 19, further comprising:

bonding an integrated circuit (IC) chip to the third interconnect structure on the backside of the first substrate, wherein the IC chip comprises an image signal processing circuit.

* * * * *